United States Patent
Mu et al.

(10) Patent No.: US 10,541,353 B2
(45) Date of Patent: Jan. 21, 2020

(54) LIGHT EMITTING DEVICES INCLUDING NARROWBAND CONVERTERS FOR OUTDOOR LIGHTING APPLICATIONS

(71) Applicant: Cree, Inc., Durham, NC (US)

(72) Inventors: Linjia Mu, Goleta, CA (US); Kenneth Lotito, Santa Barbara, CA (US); Ryan Gresback, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/809,353

(22) Filed: Nov. 10, 2017

(65) Prior Publication Data
US 2019/0148605 A1 May 16, 2019

(51) Int. Cl.
*H01L 33/50* (2010.01)

(52) U.S. Cl.
CPC ............ *H01L 33/504* (2013.01); *H01L 33/50* (2013.01); *H01L 33/507* (2013.01)

(58) Field of Classification Search
CPC ............................. H01L 33/50; H01L 33/507
See application file for complete search history.

(56) References Cited

U.S. PATENT DOCUMENTS

| 2,462,517 | A | 2/1949 | Leverenz |
|---|---|---|---|
| 3,082,061 | A | 3/1963 | Barry et al. |
| 3,575,876 | A | 4/1971 | Piper |
| 3,576,756 | A | 4/1971 | Russo |
| 3,619,265 | A | 11/1971 | Hammond et al. |
| 4,684,539 | A | 8/1987 | Chenot et al. |
| 4,829,188 | A | 5/1989 | Shinomiya et al. |
| 4,918,497 | A | 4/1990 | Edmond |
| 4,966,862 | A | 10/1990 | Edmond |
| 5,027,168 | A | 6/1991 | Edmond |
| 5,149,514 | A | 9/1992 | Sanjurjo |
| 5,210,051 | A | 5/1993 | Carter, Jr. |
| 5,338,944 | A | 8/1994 | Edmond et al. |
| 5,359,345 | A | 10/1994 | Hunter |

(Continued)

FOREIGN PATENT DOCUMENTS

| GB | 1 360 690 | 7/1974 |
|---|---|---|
| WO | 00/22065 | 4/2000 |
| WO | 2006/129228 | 12/2006 |
| WO | 2009/117287 | 9/2009 |

OTHER PUBLICATIONS

Bera et al. "Quantum Dots and Their Multimodal Applications: A Review" Materials 3:2260-2345 (2010).

(Continued)

*Primary Examiner* — Stephen M Bradley
(74) *Attorney, Agent, or Firm* — Withrow & Terranova, P.L.L.C.; Vincent K. Gustafson

(57) ABSTRACT

A light emitting device includes a light emitting diode ("LED"), a first luminescent material that is configured to emit light having an emission peak in a green wavelength range, and a second luminescent material that is configured to emit narrow-spectrum light having an emission peak in an orange wavelength range. A light output of the light emitting device, which includes a portion of the light emitted by the LED, the light having the emission peak in the green wavelength range, and the light having the emission peak in the orange wavelength range, provides an appearance of white light. Related devices are also discussed.

18 Claims, 13 Drawing Sheets

(56) References Cited

U.S. PATENT DOCUMENTS

| | | | |
|---|---|---|---|
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond et al. |
| 5,626,957 | A | 5/1997 | Benso et al. |
| 5,631,190 | A | 5/1997 | Negley |
| 5,739,554 | A | 4/1998 | Edmond et al. |
| 5,912,477 | A | 6/1999 | Negley |
| 6,039,894 | A | 3/2000 | Sanjurjo et al. |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,242,043 | B1 | 6/2001 | Lipp |
| 6,346,326 | B1 | 2/2002 | Yocom |
| 6,466,135 | B1 | 10/2002 | Srivastava et al. |
| 6,504,179 | B1 | 1/2003 | Ellens et al. |
| 6,521,915 | B2 | 2/2003 | Odaki et al. |
| 6,600,175 | B1 | 7/2003 | Baretz et al. |
| 6,616,862 | B2 | 9/2003 | Srivastava et al. |
| 6,621,211 | B1 | 9/2003 | Srivastava et al. |
| 6,791,119 | B2 | 9/2004 | Slater, Jr. et al. |
| 6,800,373 | B2 | 10/2004 | Gorczyca |
| 6,853,010 | B2 | 2/2005 | Slater, Jr. et al. |
| 6,958,497 | B2 | 10/2005 | Emerson et al. |
| 6,982,045 | B2 | 1/2006 | Menkara et al. |
| 7,095,056 | B2 | 8/2006 | Vitta et al. |
| 7,213,940 | B1 | 5/2007 | Van De Ven et al. |
| 7,224,000 | B2 | 5/2007 | Aanegola et al. |
| 7,241,400 | B2 | 7/2007 | Furusawa et al. |
| 7,400,085 | B2 | 7/2008 | Hasegawa |
| 7,453,195 | B2 | 11/2008 | Radkov |
| 7,456,499 | B2 | 11/2008 | Loh et al. |
| 7,497,973 | B2 | 3/2009 | Radkov et al. |
| 7,564,180 | B2 | 7/2009 | Brandes |
| 7,648,649 | B2 | 1/2010 | Radkov et al. |
| 7,800,121 | B2 | 9/2010 | Aanegola et al. |
| 8,057,706 | B1 | 11/2011 | Setlur et al. |
| 8,252,613 | B1 | 8/2012 | Lyons et al. |
| 8,425,071 | B2 | 4/2013 | Ruud et al. |
| 8,491,816 | B2 | 7/2013 | Hong et al. |
| 8,591,062 | B2 | 11/2013 | Hussell et al. |
| 8,596,819 | B2 | 12/2013 | Negley et al. |
| 8,622,584 | B2 | 1/2014 | Kinnune et al. |
| 8,710,487 | B2 | 4/2014 | Lyons et al. |
| 8,777,449 | B2 | 7/2014 | Van De Ven et al. |
| 8,890,403 | B2 | 11/2014 | Sakuta et al. |
| 8,906,724 | B2 | 12/2014 | Murphy et al. |
| 8,921,875 | B2 | 12/2014 | LeToquin .............. H01L 33/504 257/89 |
| 8,974,696 | B2 | 3/2015 | Kaneyoshi et al. |
| 9,028,087 | B2 | 5/2015 | Wilcox et al. |
| 9,182,096 | B2 | 11/2015 | Kinnune et al. |
| 9,324,923 | B2 * | 4/2016 | Li ..................... C09K 11/0883 |
| 9,530,944 | B2 | 12/2016 | Jacobson et al. |
| 9,685,585 | B2 | 6/2017 | Gupta et al. |
| 9,702,524 | B2 | 7/2017 | Jacobson et al. |
| 9,799,243 | B2 | 10/2017 | van de Ven et al. |
| 10,347,799 | B2 | 7/2019 | Lotito et al. |
| 2002/0110702 | A1 | 8/2002 | Gingerich |
| 2003/0155553 | A1 | 8/2003 | Mortz et al. |
| 2003/0173540 | A1 | 9/2003 | Mortz et al. |
| 2004/0218115 | A1 | 11/2004 | Kawana et al. |
| 2006/0169998 | A1 | 8/2006 | Radkov et al. |
| 2006/0221272 | A1 | 10/2006 | Negley et al. |
| 2007/0054120 | A1 | 3/2007 | Meyer et al. |
| 2007/0114562 | A1 | 5/2007 | Radkov et al. |
| 2007/0139920 | A1 | 6/2007 | Van De Ven et al. |
| 2007/0139923 | A1 | 6/2007 | Negley et al. |
| 2007/0158668 | A1 | 7/2007 | Tarsa et al. |
| 2007/0170447 | A1 | 7/2007 | Negley |
| 2007/0223219 | A1 | 9/2007 | Medendorp, Jr. et al. |
| 2007/0253209 | A1 | 11/2007 | Loh et al. |
| 2007/0267983 | A1 | 11/2007 | Van De Ven et al. |
| 2007/0278503 | A1 | 12/2007 | Van De Ven et al. |
| 2007/0278934 | A1 | 12/2007 | Van De Ven et al. |
| 2007/0278935 | A1 | 12/2007 | Harada |
| 2008/0012036 | A1 | 1/2008 | Loh et al. |
| 2008/0121921 | A1 | 5/2008 | Loh et al. |
| 2008/0130285 | A1 | 6/2008 | Negley et al. |
| 2008/0173884 | A1 | 7/2008 | Chitnis et al. |
| 2008/0179602 | A1 | 7/2008 | Negley et al. |
| 2008/0179611 | A1 | 7/2008 | Chitnis et al. |
| 2008/0198112 | A1 | 8/2008 | Roberts |
| 2008/0308825 | A1 | 12/2008 | Chakraborty et al. |
| 2008/0310154 | A1 | 12/2008 | Van De Ven et al. |
| 2009/0039375 | A1 | 2/2009 | LeToquin et al. |
| 2009/0050907 | A1 | 2/2009 | Yuan et al. |
| 2009/0050908 | A1 | 2/2009 | Yuan et al. |
| 2009/0080185 | A1 | 3/2009 | McMillan |
| 2009/0108281 | A1 | 4/2009 | Keller et al. |
| 2009/0184616 | A1 | 7/2009 | Van De Ven et al. |
| 2009/0231832 | A1 | 9/2009 | Zukauskas et al. |
| 2009/0242917 | A1 | 10/2009 | Inoue et al. |
| 2009/0261710 | A1 | 10/2009 | Zukauskas et al. |
| 2010/0059782 | A1 | 3/2010 | Fujitomo et al. |
| 2010/0103678 | A1 | 4/2010 | Van De Ven et al. |
| 2010/0119839 | A1 | 5/2010 | Chen |
| 2010/0123104 | A1 | 5/2010 | Collins et al. |
| 2010/0140634 | A1 | 6/2010 | van de Ven et al. |
| 2010/0155763 | A1 | 6/2010 | Donofrio et al. |
| 2010/0254130 | A1 | 10/2010 | Van De Ven et al. |
| 2010/0283072 | A1 | 11/2010 | Kazlas .................. G02B 6/005 257/98 |
| 2010/0289044 | A1 | 11/2010 | Krames et al. |
| 2011/0019399 | A1 | 1/2011 | Van De Ven et al. |
| 2011/0037413 | A1 | 2/2011 | Negley et al. |
| 2011/0220920 | A1 | 9/2011 | Collins et al. |
| 2011/0220929 | A1 | 9/2011 | Collins et al. |
| 2011/0260192 | A1 | 10/2011 | Kwak et al. |
| 2012/0001204 | A1 | 1/2012 | Jagt |
| 2012/0033403 | A1 | 2/2012 | Lamvik .................. F21V 7/22 362/84 |
| 2012/0051041 | A1 | 3/2012 | Edmond et al. |
| 2012/0138894 | A1 * | 6/2012 | Qian .................. H01L 51/502 257/13 |
| 2012/0146066 | A1 | 6/2012 | Tischler et al. |
| 2012/0146078 | A1 | 6/2012 | Baumann ........... C09K 11/0883 257/98 |
| 2012/0187865 | A1 | 7/2012 | Chung et al. |
| 2012/0286304 | A1 * | 11/2012 | LeToquin ............ H01L 25/0753 257/89 |
| 2012/0306356 | A1 * | 12/2012 | Yoon .................... C04B 35/597 313/503 |
| 2012/0306370 | A1 | 12/2012 | Van De Ven et al. |
| 2012/0327650 | A1 | 12/2012 | Lay et al. |
| 2013/0094186 | A1 | 4/2013 | Sun et al. |
| 2013/0193836 | A1 | 8/2013 | Seibel, II et al. |
| 2013/0208442 | A1 | 8/2013 | Reiherzer |
| 2013/0264937 | A1 | 10/2013 | Sakuta et al. |
| 2013/0286304 | A1 | 10/2013 | Lin et al. |
| 2014/0313376 | A1 | 10/2014 | Van Nieuwenhove et al. |
| 2014/0347885 | A1 | 11/2014 | Wilcox et al. |
| 2014/0355302 | A1 | 12/2014 | Wilcox et al. |
| 2015/0060922 | A1 | 3/2015 | Wilcox et al. |
| 2015/0086169 | A1 * | 3/2015 | Breen .................. C09K 11/025 385/131 |
| 2015/0171284 | A1 | 6/2015 | Bechtel et al. |
| 2015/0253488 | A1 | 9/2015 | Wilcox et al. |
| 2015/0295144 | A1 | 10/2015 | Weiler et al. |
| 2015/0362168 | A1 | 12/2015 | Power et al. |
| 2016/0218254 | A1 | 7/2016 | Jacobson et al. |
| 2016/0372638 | A1 | 12/2016 | Todorov et al. |
| 2017/0005241 | A1 | 1/2017 | Lotito et al. |
| 2018/0010039 | A1 * | 1/2018 | Dong .................... C09K 11/06 |
| 2019/0148602 | A1 | 5/2019 | Mu et al. |

OTHER PUBLICATIONS

Cao et al. "Preparation of Eu3+-Y3+ co-doping red-emitting phosphors for white-light emitting diodes (W-LEDs) application and investigation of their optical characteristics" Journal of Materials Science: Materials in Electronics 22:510-514 (2011).

(56) References Cited

OTHER PUBLICATIONS

Chen et al. "Greatly enhanced and controlled manganese photoluminescence in water-soluble ZnCdS:Mn/ZnS core/shell quantum dots" Chemical Physics Letters 488:73-76 (2010).

Chen et al. "Light Converting Inorganic Phosphors for White Light-Emitting Diodes" Materials 3:2172-2195 (2010).

Chowdhury et al. "Red Line Emitting Phosphors—Enabling High Performance LEDs and LED systems" presentation at The LED Show (10 pages) (Feb. 24-26, 2015).

Garcia-Santamaria, Florencio "PFS, a Narrow Red LED Phosphor (K2SiT6:Mn4+)" GE 2015 Global Phosphor Summit (22 pages) (2015).

Jacobsohn et al. "Preparation and Characterization of Rare Earth Doped Fluoride Nanoparticles" Materials 3:2053-2068 (2010).

Jean et al. "Y2O2S:Eu Red Phosphor Powders Coated with Silica" Journal of the American Ceramic Society 83(8):1928-1934 (2000).

Lehmann et al. "Synthesis of Eu3+-Doped Core and Core-Shell Nanoparticles and Direct Spectroscopic Identification of Dopant Sites at the Surface and in the Interior of the Particles" Journal of the American Chemical Society 126:14935-14942 (2004).

Li et al. "LaF3, CeF3, CeF3:Tb3+, and CeF3:Tb3+@LaF3 (Core-Shell) Nanoplates: Hydrothermal Synthesis and Luminescence Properties" The Journal of Physical Chemistry C 112:2904-2910 (2008).

Paulusz, A. G. "Efficient Mn(IV) Emission in Fluorine Coordination" Journal of the Electrochemical Society 120(7):942-947 (1973).

Reiss et al. "Core/Shell Semiconductor Nanocrystals" Small 5(2):154-168 (2009).

Setlur, Anant "Phosphors for LED-based Solid-State Lighting" The Electrochemical Society Interface (pp. 32-36) (2009).

Setlur, Anant "TriGain TM LED phosphor system using red Mn4+-doped complex fluorides" GE Global Research 2015 DOE R&D workshop (10 pages) (Jan. 2015).

\* cited by examiner

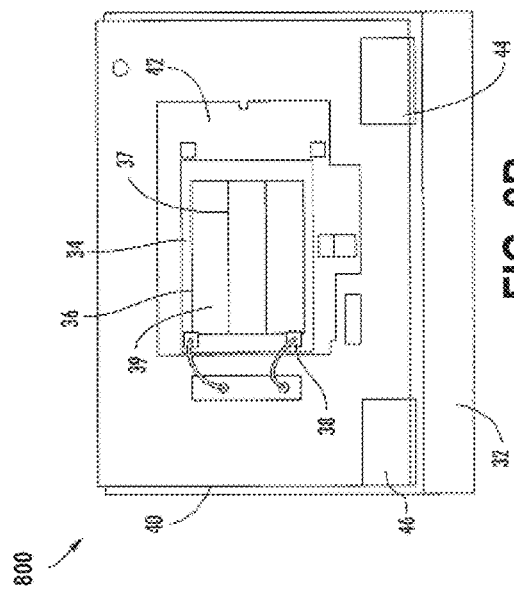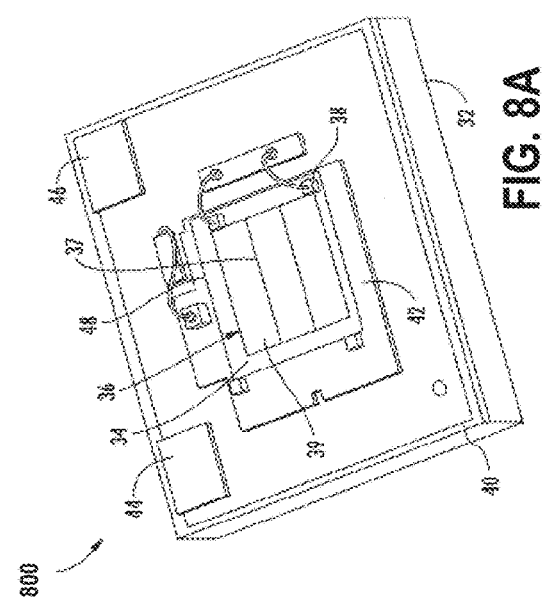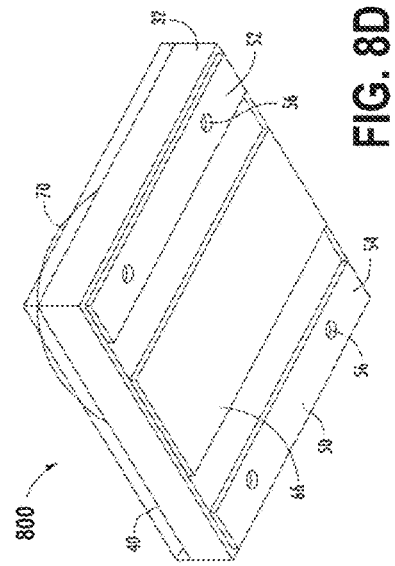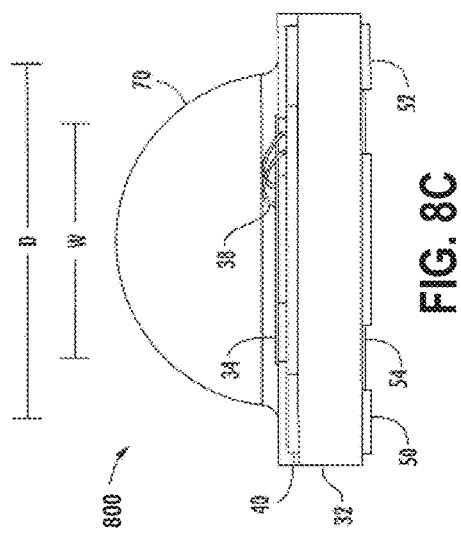

LIGHT EMITTING DEVICES INCLUDING NARROWBAND CONVERTERS FOR OUTDOOR LIGHTING APPLICATIONS

FIELD

The present disclosure relates to light emitting devices, and more particularly, to semiconductor light emitting devices that include luminescent materials.

BACKGROUND

Light emitting devices may include, for example, incandescent bulbs, fluorescent lights, and semiconductor light emitting devices, such as light emitting diodes ("LEDs"). LEDs may include a series of semiconductor layers that may be epitaxially grown on a substrate such as, for example, a sapphire, silicon, silicon carbide, gallium nitride, or gallium arsenide substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, the electrons will "collide" with corresponding holes and recombine, such that a photon of light may be emitted. The wavelength distribution of the light generated by an LED generally depends on the semiconductor materials used and the structure of the thin epitaxial layers that make up the "active region" of the device, where the electron-hole recombination occurs.

LEDs are typically monochromatic light sources that appear to emit light having a single color. Thus, the spectral power distribution of the light emitted by LEDs may be centered about a "peak" wavelength, which is the wavelength where the spectral power distribution or "emission spectrum" of the LED reaches its maximum as detected by a photodetector. The width of the spectral power distribution of LEDs is typically between about 10 nm and 30 nm, where the width may be measured at half of the maximum illumination on each side of the emission spectrum (this width may be referred to as the full width at half maximum or "FWHM" width).

To generate white light, LED lamps have been provided that include several LEDs that each emit light of a different color, where the different-colored light emitted by the LEDs combine to produce a desired intensity and/or color of white light. For example, simultaneously energizing red, green, and blue LEDs may result in a combination of light that may appear white, or nearly white, depending on, for example, the relative intensities, peak wavelengths, and spectral power distributions of the source red, green, and blue LEDs.

Additionally or alternatively, white light may also be produced by surrounding a single LED with one or more luminescent materials, such as phosphors, that absorb some of the light emitted by the LED and responsively emit light of one or more other wavelengths. This process is also referred to herein as 'converting' some of the light emitted by the LED to the light of the other color(s). The combination of the light emitted by the single colored LED that is not converted by luminescent materials and the light of other color(s) that are emitted by the luminescent materials may produce light that appears to be white or near white to an observer.

Some white LEDs may use conventional rare earth doped inorganic red and green phosphors. For example, a nitride based red phosphor and a garnet green/yellow phosphor may be used in combination with a blue emitting LED to generate white light output. For instance, a white LED lamp may be formed by coating a gallium nitride based blue LED with a yellow luminescent material, such as a cerium doped yttrium aluminum garnet phosphor, which is commonly referred to as YAG:Ce. The blue LED produces an emission with a peak wavelength of, for example, about 455 nm. Some of blue light emitted by the LED passes between and/or through the YAG:Ce phosphor particles without being down-converted (i.e., converted to light having a longer wavelength), while other of the blue light emitted by the LED is absorbed by the YAG:Ce phosphor, which becomes excited and emits yellow fluorescence with a peak wavelength of about 550 nm (i.e., the blue light is down-converted to yellow light). The combination of blue light and yellow light that is emitted by the coated LED may appear white to an observer. Such light is typically perceived as being cool white in color, as it is primarily comprises light on the lower half (shorter wavelength side) of the visible emission spectrum. To make the emitted white light appear more "warm" and/or exhibit better color rendering properties, red-light emitting luminescent materials such as $Eu^{2+}$ doped $CaAlSiN_3$-based phosphor particles may be added to the coating, which increases color rendering at the expense of efficiency.

SUMMARY

Embodiments of the present disclosure are directed to light emitting devices that provide white light output with spectral and efficacy gains. In some embodiments, such gains can be achieved by replacement of broad-spectrum red-emitting luminescent materials with one or more narrow-spectrum luminescent materials.

According to some embodiments, a light emitting device includes a light emitting diode ("LED"), a first luminescent material that is configured to emit light having an emission peak in a green (495 nm to 565 nm) and/or green/yellow wavelength range (495 nm to 579 nm) responsive to incident light, and a second luminescent material that is configured to emit narrow-spectrum light having an emission peak in an orange wavelength range (580 nm to 609 nm) responsive to incident light. A light output of the light emitting device, which includes a portion of the light emitted by the LED, the light having the emission peak in the green wavelength range, and the light having the emission peak in the orange wavelength range, provides an appearance of white light.

In some embodiments, the emission peak in the orange wavelength range may be between 590 nanometers (nm) and 609 nm. In some embodiments, the narrow-spectrum light from the second luminescent material having the emission peak in the orange wavelength range may have a full width at half maximum (FWHM) of less than 40 nm.

In some embodiments, the light output of the light emitting device may have a color rendering index (CRI) of about 75 or less.

In some embodiments, the light output of the light emitting device may have a color rendering index (CRI) of greater than about 70.

In some embodiments, the light output of the light emitting device may have a color rendering index (CRI) of about 65 or less.

In some embodiments, the light output of the light emitting device may have a correlated color temperature (CCT) of about 2200 Kelvin (K) or more.

In some embodiments, the light output of the light emitting device may have a correlated color temperature (CCT) of about 3000 K or 4000 K or more.

In some embodiments, the light output of the light emitting device may have a luminous efficacy of radiation (LER) of about 360 lumens per watt-optical (lm/W-optical) to about 450 lm/W-optical.

In some embodiments, the light output of the light emitting device may have a luminous efficacy of about 275 lumens per blue optical watt (lm/blue-optW) to about 350 lm/blue-optW.

In some embodiments, the first luminescent material may include at least one broad-spectrum luminescent material, and the emission peak in the orange wavelength range is within about 50 nanometers (nm) or less of the emission peak in the green wavelength range.

In some embodiments, the first luminescent material may be a narrow-spectrum luminescent material, and the emission peak in the orange wavelength range may be within about 75 nanometers (nm) or less of the emission peak in the green wavelength range. In some embodiments, full width at half maximum emission bandwidths of the light emitted by the first and second luminescent materials may be within respective non-overlapping wavelength ranges.

In some embodiments, the light output of the light emitting device may be free of emission peaks between the emission peak in the green wavelength range and the emission peak in the orange wavelength range.

In some embodiments, the light having the emission peak in an orange wavelength range may be free of greater than 2% of integrated optical power intensity beyond 660 nanometers (nm).

In some embodiments, the light emitting device may further include a third luminescent material that is configured to emit narrow-spectrum light having an emission peak in a blue wavelength range responsive to incident light. The light emitted by the LED may be light in a violet wavelength range.

In some embodiments, the light emitting device may be free of broad-spectrum luminescent materials that emit light having an emission peak in a red wavelength range.

In some embodiments, the light output may be free of emission peaks beyond 700 nanometers (nm), beyond 650 nm, or beyond 615 nm.

According to some further embodiments, a light emitting device includes a light emitting diode ("LED") and at least one narrow-spectrum luminescent material that is configured to absorb incident light and responsively emit light having an emission peak in a first wavelength range that is longer than that of the light emitted by the LED, such as an orange or green wavelength range. The light emitting device is free of broad-spectrum luminescent materials that emit light having an emission peak in a red wavelength range. A light output of the light emitting device, which includes a remaining portion of the light emitted by the LED and the light emitted by the at least one narrow-spectrum luminescent material, provides an appearance of white light having a color rendering index of about 75 or less.

In some embodiments, the first wavelength range may be an orange wavelength range, and the light emitting device may further include a broad-spectrum luminescent material that is configured to absorb a portion of the light emitted by the LED and emit light having an emission peak in a green wavelength range. In some embodiments, the emission peak in the orange wavelength range may be within about 50 nanometers (nm) or less of the emission peak in the green wavelength range.

In some embodiments, the at least one narrow-spectrum luminescent material may include first and second narrow-spectrum luminescent materials that are configured to absorb first and second portions of the light emitted by the LED and emit light having emission peaks in orange and green wavelength ranges, respectively. In some embodiments, full width at half maximum emission bandwidths of the light emitted by the first and second narrow-spectrum luminescent materials may be within respective non-overlapping wavelength ranges.

In some embodiments, the light emitting device may be free of broad-spectrum luminescent materials.

In some embodiments, the LED may be configured to emit light in a violet wavelength range. The at least one narrow-spectrum luminescent material may further include a third narrow-spectrum luminescent material that is configured to absorb a third portion of the light emitted by the LED and emit light having an emission peak in a blue wavelength range.

In some embodiments, the first wavelength range may be a green wavelength range and has a full width at half maximum (FWHM) of less than 60 nanometers (nm). The LED may be a first LED that is configured to emit light in a blue wavelength range, and the light emitting device may further include a second LED that is configured to emit light in an orange wavelength range.

In some embodiments, the light emitted by the at least one narrow-spectrum luminescent material may have the emission peak between 590 nanometers (nm) and 609 nm and has a full width at half maximum (FWHM) of 40 nm or less.

Other devices and methods according to embodiments described herein will be or become apparent to one with skill in the art upon review of the following drawings and detailed description. It is intended that all such additional devices and methods be included within this description, be within the scope of the present inventive subject matter, and be protected by the accompanying claims. Moreover, it is intended that features disclosed herein can be implemented separately or combined in any way and/or combination.

BRIEF DESCRIPTION OF THE DRAWINGS

The accompanying drawings, which are incorporated in and constitute a part of this specification, illustrate embodiments of the invention, where like reference numbers in the drawing figures refer to the same feature or element and may not be described in detail for every drawing figure in which they appear and, together with a general description of the invention given above, and the detailed description of the embodiments given below, serve to explain the principles of the invention.

FIGS. 8A-8D are various views of a semiconductor light emitting device according to embodiments of the present disclosure.

FIGS. 10A-10D are various views of another packaged light emitting device that includes multiple LED chips according to embodiments of the present disclosure.

DETAILED DESCRIPTION OF EMBODIMENTS

Figure 1A:
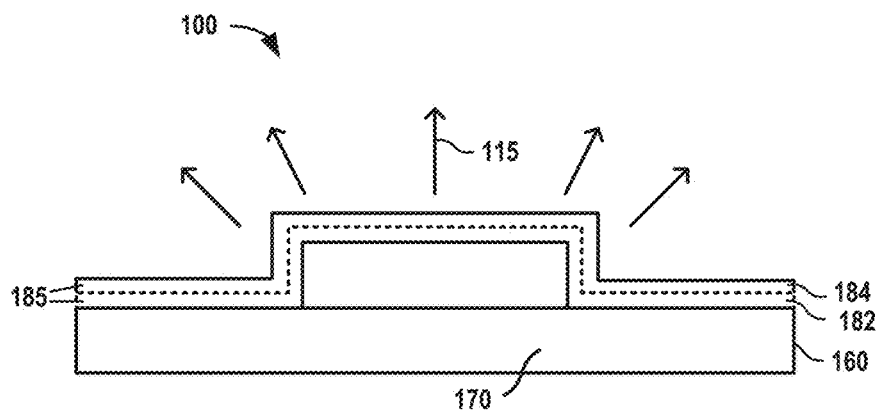
FIG. 1A is a block diagram illustrating a semiconductor light emitting device including at least one narrow-spectrum luminescent material for providing white light output with reduced CRI and increased efficiency according to some embodiments of the present disclosure.

As used herein, the term "semiconductor light emitting device" may include LEDs, laser diodes and any other light emitting devices that includes one or more semiconductor layers, as well as packaged lamps, bulbs, fixtures and the like which include such devices. The semiconductor layers included in these devices may include silicon, silicon carbide, gallium nitride and/or other semiconductor materials, an optional semiconductor or non-semiconductor substrate, and one or more contact layers which may include metal and/or other conductive materials. The expression "light emitting device," as used herein, is not limited, except that it be a device that is capable of emitting light.

Visible light may include light having many different wavelengths. The apparent color of visible light can be illustrated with reference to a two-dimensional chromaticity diagram, such as the 1931 CIE Chromaticity Diagram illustrated in FIG. 1B, which provides a reference for defining colors as weighted sums of colors. As shown in FIG. 1B, colors on the CIE Chromaticity Diagram are defined by x and y coordinates (i.e., chromaticity coordinates, or color points) that fall within a generally U-shaped area. Colors on or near the outside of the area are saturated colors composed of light having a single wavelength, or a very small wavelength distribution, while colors on the interior of the area are unsaturated colors that are composed of a mixture of different wavelengths. White light, which can be a mixture of many different wavelengths, is generally found near the middle of the diagram, in the region labeled 10 in FIG. 1B.

There are many different hues of light that may be considered "white," as evidenced by the size of the region 10. For example, some "white" light, such as light generated by high-power sodium vapor lighting devices, may appear yellowish in color, while other "white" light, such as light generated by some fluorescent lighting devices, may appear more bluish in color.

A combination of light from light sources emitting light of first and second colors may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer. Each point in the graph of FIG. 1B is referred to as the "color point" of a light source that emits a light having that color. As shown in FIG. 1B a locus of color points that is referred to as the "black-body" locus 15 exists which corresponds to the location of color points of light emitted by a black-body radiator that is heated to various temperatures. The black-body locus 15 is also referred to as the "planckian" locus because the chromaticity coordinates (i.e., color points) that lie along the black-body locus obey Planck's equation: $E(\lambda,T)=A\,\lambda^{-5}/(e^{B/T}-1)$, where E is the emission intensity, $\lambda$ is the emission wavelength, T is the color temperature of the black-body emitter and A and B are constants. Color coordinates that lie on or near the black-body locus 15 yield white light to a human observer.

As a heated object becomes incandescent, it first glows reddish, then yellowish, and finally bluish with increasing temperature. This occurs because the wavelength associated with the peak radiation of the black-body radiator becomes progressively shorter with increased temperature, consistent with the Wien Displacement Law. Illuminants that produce light which is on or near the black-body locus 15 can thus be described in terms of their correlated color temperature (CCT). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000 K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color. Warm white light is generally a pleasing color to a human observer. Warm white light with a CCT of 2500K to 3300K may be preferred for certain applications.

The ability of a light source to accurately reproduce color in illuminated objects is typically characterized using the color rendering index ("CRI"). The CRI of a light source is a modified average of the relative measurements of how the color rendition of an illumination system compares to that of a reference black-body radiator when illuminating eight reference colors. Thus, the CRI is a relative measure of the shift in surface color of an object when lit by a particular light source. The CRI equals 100 if the color coordinates of a set of test colors being illuminated by the illumination system are the same as the coordinates of the same test colors being irradiated by the black-body radiator. Monochromatic light sources have a CRI of essentially zero. Light sources for general illumination applications with a CRI of less than 50 are generally considered very poor and are typically only used in applications where economic issues preclude other alternatives. Light sources with a CRI value between 70 and 80 have application for general illumination where the colors of objects are not critical, such as some outdoor lighting applications.

The present disclosure describes various luminescent materials that have peak emission wavelengths in various color ranges. For purposes of the present disclosure, the various color ranges described herein are defined as follows:

Violet wavelength range=wavelengths between 380-434 nm

Blue wavelength range=wavelengths between 435-494 nm

Green wavelength range=wavelengths between 495-565 nm

Green/yellow wavelength range=wavelengths between 495-579 nm

Orange wavelength range=wavelengths between 580-609 nm

Red/orange wavelength range=wavelengths between 590-609 nm

Red wavelength range=wavelengths between 610-750 nm

As described herein, a luminescent material that emits light within a particular color range may also be referred to as a [color]-emitting luminescent material, e.g., an orange-emitting luminescent material refers to a luminescent material that emits light having peak wavelengths between about 580 and 609 nm.

Phosphors are luminescent materials that may be most widely used to convert a light emitted by a single-color (typically blue or violet) LED into a light of a different color. Herein, the term "phosphor" may refer to any material that absorbs light at one wavelength and re-emits light at a different wavelength in the visible spectrum, regardless of the delay between absorption and re-emission and regardless of the wavelengths involved. Thus, the term "phosphor" encompasses materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths. In addition to phosphors, other luminescent materials include scintillators, day glow tapes, nanophosphors, quantum dots, and inks that glow in the visible spectrum upon illumination with (e.g., ultraviolet) light.

As described herein, a medium that includes one or more luminescent materials that is positioned to receive light that is emitted by an LED or other semiconductor light emitting device is referred to herein as a "recipient luminophoric medium." Exemplary recipient luminophoric mediums include layers having luminescent materials that are coated or sprayed directly onto a semiconductor light emitting device or on surfaces of the packaging thereof, and clear encapsulants (e.g., epoxy-based or silicone-based curable resin) that include luminescent materials that are arranged to partially or fully cover a semiconductor light emitting device. A recipient luminophoric medium may include one medium layer or the like in which one or more luminescent materials are mixed, multiple stacked layers or mediums, each of which may include one or more of the same or different luminescent materials, and/or multiple spaced apart layers or mediums, each of which may include the same or different luminescent materials.

A recipient luminophoric medium that includes, for example, a green/yellow phosphor, may be used in conjunction with a blue LED to provide a white light emitting device. Such a device typically emits cool white light that often has a lower CRI value. In order to increase the "warmth" of the emitted white light and/or to improve the CRI of the device, red phosphor particles may be added to the recipient luminophoric medium. Such red phosphors may include nitride-based phosphors. The nitride-based red phosphors are typically characterized by a broad-spectrum emission (e.g., FWHM of greater than 70 nm) and relatively high peak wavelengths (e.g., between about 630 nm and about 660 nm). FWHM is the width of a spectrum curve measured between those points on the y-axis which are half the maximum amplitude. Herein, phosphors or other luminescent materials that have FWHM of greater than 60 nm, for example, greater than 70 nm, are referred to as "broad-spectrum" luminescent materials or emitters.

The above-described nitride-based red phosphors may be used in conjunction with, for example, green or green/yellow phosphors and a blue LED to provide a warm white LED lamp that has a high CRI value, such as a CRI value that exceeds 90. However, such LEDs tend to be relatively inefficient. For example, typical conventional warm white LEDs (e.g., correlated color temperatures of between 2700 K and 4100 K) that have recipient luminophoric mediums that include the above-described nitride-based red phosphors may have, for example, a lumen equivalent output of about 270-320 lumens per watt of optical power (Lum/W-Optical). As known to those of skill in the art, the "lumen equivalent output" or "luminous efficacy of radiation" (LER) of a light emitting device refers to the number of lumens of light output by the device per watt of optical power emitted by the light source (as measured in Lum/W-Optical), while the "luminous efficacy" refers to the ratio of luminous flux to power (as measured in lumens per blue optical watt (lm/blue-optW)). Measurement in lm/blue-opt W refers to the lumen output of the device of the finished device per optical watt of the bare blue die measured prior to addition of the recipient luminophoric medium. Measurement in lm/blue-opt W removes the impact of the blue LED efficiency.

The lower lumen equivalent output of the above-described conventional warm white LEDs may in part be attributed to the high Stokes shift of these devices (the Stokes shift refers to the difference between the peak wavelength of the light absorbed by the phosphor and the peak wavelength of the light emitted by the phosphor). These high Stokes shifts can limit the conversion efficiency of the red phosphor (i.e., the percentage of blue light that is absorbed by the phosphor that is actually converted to red light is relatively low), resulting in the decreased lumen equivalent output. Additionally, the human eye does not perceive light well that has wavelengths that exceed about 630 or 640 nm, and hence light emitted in the higher portion of the red color range does not significantly contribute to the lumen equivalent output of a device. As many conventional nitride-based red phosphors have peak wavelengths that exceed 630 or 640 nm, at least half of the emission spectrum of such phosphors provides little overall contribution to the lumen equivalent output of a light emitting device that includes such phosphors. That is, some conventional uses of luminescent materials may be directed toward broadband red emission to improve CRI at the expense of efficiency.

Other nitride-based red phosphors are available that have lower peak wavelengths (e.g., between about 605 nm and about 629 nm). It has been discovered that white LEDs having significantly improved lumen equivalent outputs may be provided by using these lower wavelength (605 to 629 nm) broad-spectrum red phosphors in place of the above described conventional broad-spectrum red phosphors that have higher wavelengths (630 to 660 nm) and typically broader emission spectra (FWHM that exceed 70 nm). By replacing the above-described conventional broad-spectrum red phosphors with broad-spectrum red phosphors that have lower peak wavelengths, the Stokes shift can be reduced and the percentage of the emission spectra that is well-perceived by the human eye can be increased significantly.

Unfortunately, when a light emitting device that includes a blue LED and a recipient luminophoric medium that includes a conventional broad-spectrum red phosphor is modified to instead use a lower peak wavelength broad-spectrum red phosphor, the CRI of the light emitting device tends to be reduced due to the reduced contribution of spectral energy in the longer wavelength portions of the red color band. The CRI values of such a light emitting device can be partially or completely recovered by adding one or more "narrow-spectrum" luminescent materials to the recipient luminophoric medium. Herein, a "narrow-spectrum" luminescent material or emitter refers to a luminescent material that has an emission spectrum having a FWHM of less than 60 nm. For example, some narrow-spectrum luminescent materials described herein may have a FWHM of less than 50 nm, less than 40 nm, less than 35 nm, less than 30 nm, or less than 20 nm.

The combination of a lower peak wavelength broad-spectrum red phosphor and a narrow-spectrum luminescent material (such as, for example, red quantum dots that have an emission spectrum with a peak wavelength of 618 nm and a FWHM width of about 30 nm) may significantly increase the CRI value of the light emitting device, without significantly degrading its lumen equivalent output. Moreover, the narrow-spectrum luminescent material may have an extremely compact emission spectrum such as, for example, an emission spectrum having a FWHM width of less than about 20 nm. For example, f-to-f transition phosphors may have emission spectrum with FWHM widths of less than 10 nm. Herein narrow-spectrum luminescent materials that have emission spectrum with a FWHM width of less than 20 nm are referred to as "line-emitter luminescent materials."

Some embodiments of the present disclosure may arise from realization that losses in luminous efficacy of a light emitting device may be attributed to broad-spectrum luminescent materials that emit light into the deep red to infrared region of the spectrum (for example, with a FWHM of greater than about 70 nm), as a large portion of the light output may be wasted due to the insensitivity of human eye to long wavelength red light. Luminescent materials that may satisfy lighting requirements with a reduction and/or elimination of broad-spectrum red-emitting luminescent materials may thereby allow for increased efficiency.

As such, some embodiments of the present disclosure provide light emitting devices including tuned narrowband or narrow emission converters (also referred to herein as narrow-spectrum luminescent materials) for outdoor lighting or other lighting applications having requirements that may differ from indoor lighting requirements. For example, outdoor lighting may have greater requirements with respect to output power, efficiency, and/or environmental protection, but may have lesser requirements with respect to the quality (as indicated by CRI) or correlated color temperature (CCT) of the light. In particular, lower CRI values may be acceptable for outdoor lighting applications as compared to warm white lighting for indoor applications. Also, in some instances, outdoor street lighting may be required to have particular correlated color temperatures (CCT), for example 3500 Kelvin (K) or 3000 K or as low as 2200 K.

The use of narrow-spectrum luminescent materials according to embodiments of the present disclosure can increase efficiency and intensity in such applications by reducing the portion of light emitted by an LED that is down-converted. For example, tuned narrowband converters may allow for increased luminous efficacy while achieving a CRI of about 75 or less, as may be acceptable for some outdoor lighting applications described herein. In contrast, as noted above, some conventional solid state lighting devices may use narrow-spectrum red-emitting luminescent materials to increase CRI (rather than reducing CRI in accordance with embodiments of the present disclosure) without significantly degrading lumen equivalent output. That is, the incorporation of narrow-spectrum red-, orange-, or red/orange-emitting luminescent materials described herein, which have been conventionally used to increase CRI, may be counterintuitive in applications where CRI requirements are lower, such as outdoor lighting applications. Embodiments of the present disclosure may thereby provide unexpected results by using narrow-spectrum luminescent materials to reduce CRI and increase luminous efficacy. In further embodiments, narrow-spectrum luminescent materials may be used to reduce or minimize cross-talk caused by the overlap between the emission spectra and absorption spectra of luminescent materials, which can also improve luminous efficacy by reducing down-conversion events, where each down-conversion event has a probability to not (re)emit.

Particular embodiments of the present disclosure may reduce or eliminate long-wavelength red light in the light output of a light emitting device by shifting a peak emission wavelength (also referred to herein as an emission peak) of the narrow-spectrum luminescent material towards the red/orange or orange wavelength range of the visible spectrum. Shifting emission away from the longer red wavelength range and towards the orange wavelength range (for example, to peak emission of less than 609 nm or less than about 600 nm) may further improve efficacy at the expense of CRI, and may provide a warmer color with a lower correlated color temperature (CCT). Narrow-spectrum luminescent materials as described herein may be particularly applicable in providing very-warm CCT (e.g., 2200 K to 2700 K), for example, for outdoor lighting where a similar appearance as conventional street-lighting is desired (e.g., similar to high-pressure sodium-based street lamps which provide light output with a temperature of about 2200K).

In further embodiments, narrow-spectrum luminescent materials are used to replace conventional broad-spectrum luminescent materials in white lighting applications with a CRI of greater than 70 and/or less than 80, such that the light emitting devices are free of broad-spectrum luminescent materials. The narrow emission of these converters can be used to achieve spectral optimization and increase luminous efficacy by better matching with the human eye's sensitivity (as shown for example in FIG. 3), resulting in improved system efficacy of white LEDs (as shown for example in FIG. 4).

Figure 1B:
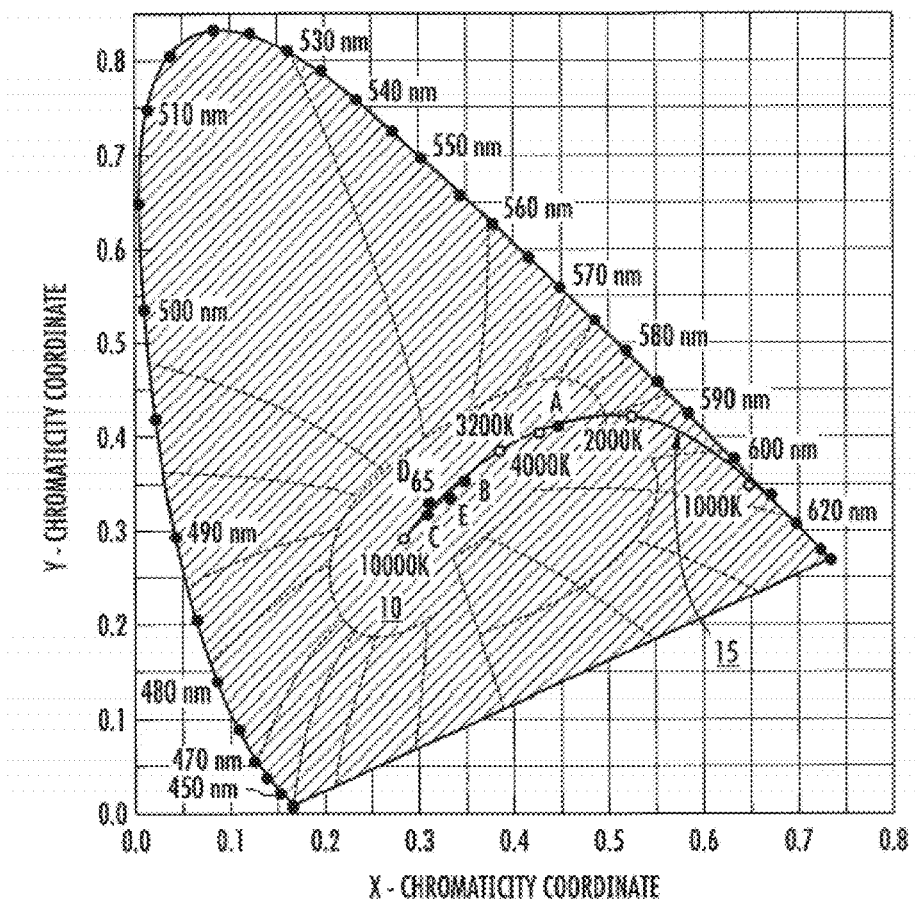
FIG. 1B illustrates the 1931 CIE Chromaticity Diagram for defining colors by chromaticity coordinates.

FIG. 1A illustrates a light emitting device 100 that is configured to provide white light output 115 according to some embodiments of the present disclosure. The light emitting device 100 includes an LED 170 on a submount or substrate 160, and a recipient luminophoric medium 185. The recipient luminophoric medium 185 may include multiple materials, such as one or more luminescent materials 182, 184 and/or encapsulants (e.g., polymers (such as silicone) or glass) containing the luminescent materials 182, 184, which may be blended or mixed in one layer, may be multiple stacked layers or materials, or may be a combination of mixed and stacked layers. Some example luminophoric media including multiple materials are described in U.S. Pat. No. 9,685,585 to Gupta et al., the disclosure of which is incorporated by reference herein.

The luminescent materials 182, 184 absorb and responsively emit light of wavelengths greater than that of the light emitted by the LED 170 such that the overall light output 115 provides an appearance of white light. For example, at least one of the luminescent materials 182, 184 may provide peak emission in the red wavelength range that is not beyond about 650 nm, or in the orange wavelength range not beyond about 610 nm. In some embodiments, the peak emission in the orange wavelength range may be between about 598 nm to 603 nm. The spectral distribution of the light output 115 from the light emitting device 100 may thus be free of emission peaks beyond about 700 nm, beyond about 650 nm, or beyond about 615 nm.

The light emitting device 100 is free of broad-spectrum luminescent materials that emit light having an emission peak in the red wavelength range (e.g., between 610-750 nm with a FWHM of more than 70 nm). As noted above, broad-spectrum red-emitting materials that emit light into the red or infrared wavelength ranges may have low luminous efficacy, which can negatively affect the luminous efficacy of the white light output 115 of the light emitting device 100. The absence of such broad-spectrum red-emitting materials in light emitting devices according to embodiments of the present disclosure thereby allows for light output 115 with improved system efficacy. In some embodiments, the light output 115 of the light emitting device 115 may be free of emission in the red wavelength range altogether.

Still referring to FIG. 1A, one or more of the luminescent materials 182, 184 is a narrow-spectrum luminescent material having a FWHM of less than 40 nm, less than 35 nm, or even less than 30 nm. In particular embodiments for outdoor lighting applications with a CRI of about 75 or less, a narrow-spectrum orange or red/orange emitter (e.g., having an emission peak in the 580-609 nm wavelength range) may be used as one of the luminescent materials 182, 184. Such narrow-spectrum orange emitters may provide higher efficacy than some conventional phosphors, particularly as the converter efficiency of some conventional red/orange-emitting phosphors is already close to unity, leaving little room to improve. Therefore, narrow-spectrum luminescent materials that emit light in the orange or red/orange wavelength range can be used in accordance with embodiments described herein to provide spectral (LER) and efficacy (LF) gains. Various combinations of narrow-spectrum luminescent materials and LEDs to provide white light output according to some embodiments of the present disclosure are illustrated in the examples of FIGS. 2A-2G.

While phosphors may be used as narrow-spectrum luminescent materials in some embodiments, luminescent quantum dots (QDs) or nanomaterials with other morphologies may be used as narrow-spectrum luminescent materials in further embodiments. Such materials may offer unique advantages because of their tunable emission and broadband absorption of blue light. Such emission tunability may allow for the design and fabrication of nanoparticles for various applications by simply modifying their size, morphology, or composition. Also, a smaller amount of QDs can be used to convert the same amount of light, due to the higher absorption coefficient of many QDs as compared to phosphors. As a result of the relatively high potency and small size of QDs, scattering problems with respect to phosphors in LED packages can be reduced or eliminated.

Specific examples of the narrow-spectrum down-converters/luminescent materials that may be used in light emitting devices according to some embodiments of the present disclosure may include, but are not limited to: cadmium (Cd)-based QDs (such as $CdSe/CdS/SiO_x$, $CdSe/CdS/ZnS/SiO_x$, silicate (including potassium silicate) encapsulated Cd QDs, and/or other stabilized Cd QDs described in U.S. Patent Application Publication No. 2017/0005241 filed Jun. 29, 2016, the disclosure of which is incorporated by reference); Cd-free QDs (such as perovskite QDs and their stabilized structures using methods described in U.S. patent application Ser. No. 15/809,213 entitled "STABILIZED LUMINESCENT NANOPARTICLES COMPRISING A PEROVSKITE SEMICONDUCTOR AND METHOD OF FABRICATION" filed Nov. 10, 2017, the disclosure of which is incorporated by reference in its entirety), InP QDs and their stabilized structures using methods described in U.S. Patent Application Publication No. 2017/0005241, and/or Cu-based QDs (e.g., $CuIn(S/Se)_2$) and their stabilized structures using methods described in U.S. Patent Application Publication No. 2017/0005241); and phosphors with narrow emission (such as $Eu^{3+}$ doped phosphors (e.g., $Zn_2SnO_4:Eu^{3+}$), $Eu^{2+}$ doped phosphors (e.g., $CaS:Eu^{2+}$, $SrS:Eu^{2+}$), $Sm^{3+}$ doped phosphors, and/or other phosphors with narrow emission in orange region of the spectrum). Other luminescent materials that may be used in light emitting devices according to some embodiments of the present disclosure may include those described in U.S. patent application Ser. No. 15/809,241 entitled "STABILIZED QUANTUM DOT COMPOSITE AND METHOD OF MAKING A STABILIZED QUANTUM DOT COMPOSITE" filed Nov. 10, 2017, the disclosure of which is incorporated by reference in its entirety.

In some embodiments, CdSe/CdS/ZnS quantum dots are used as a narrow-spectrum red/orange emitting down-converter, for example, by replacing a conventional red phosphor in a light emitting device that includes a blue-emitting LED and a green/yellow phosphor (such as Ce-doped garnet). In particular, CdSe/CdS/ZnS QDs with the core/shell/shell structure synthesized to provide peak emission at about 603 nm with a FWHM of about 35 nm and have a quantum yield (QY) of about 85% in package may be used. However, it will be understood that the QY and FWHM of CdSe/CdS/ZnS QDs used in this specific example may not be optimized in the package. Quantum yield (QY) of a converter may refer to the ratio of the sum of photons downconverted by the converter to the number of absorbed source (here, blue) photons. In one method, the number of blue (source) absorbed photons is determined by measuring a (blue) LED without downconverting material (converter) and then adding downconverting material (only the one converter of which QY is being measured, green or red in this case) and measuring the spectra a second time and taking the difference of the blue photons without downconverting material to the blue photons with downconverting material. Using a red down-converter as an example, QY=Red photons/[(Blue photons w/o red down-converter)−(Blue photons with red down-converter)]. Narrow converters with higher QY should enable higher efficacy and even narrower emitters will enable both higher luminous efficacy of radiation (LER) and efficacy. Also, environmental protection may be provided using a potassium-silicate or silicate-based encapsulant in some embodiments.

As a reference, a conventional red phosphor with peak emission at about 613 nm and Ce-doped garnet green phosphor may be used for comparison. Representative warm white spectra (at 3000 K) of a light emitting device including this conventional luminescent material composition 310 and a light emitting device including narrow-spectrum luminescent materials 315 according to some embodiments of the present disclosure are shown in the graph of FIG. 3.

Figure 3:
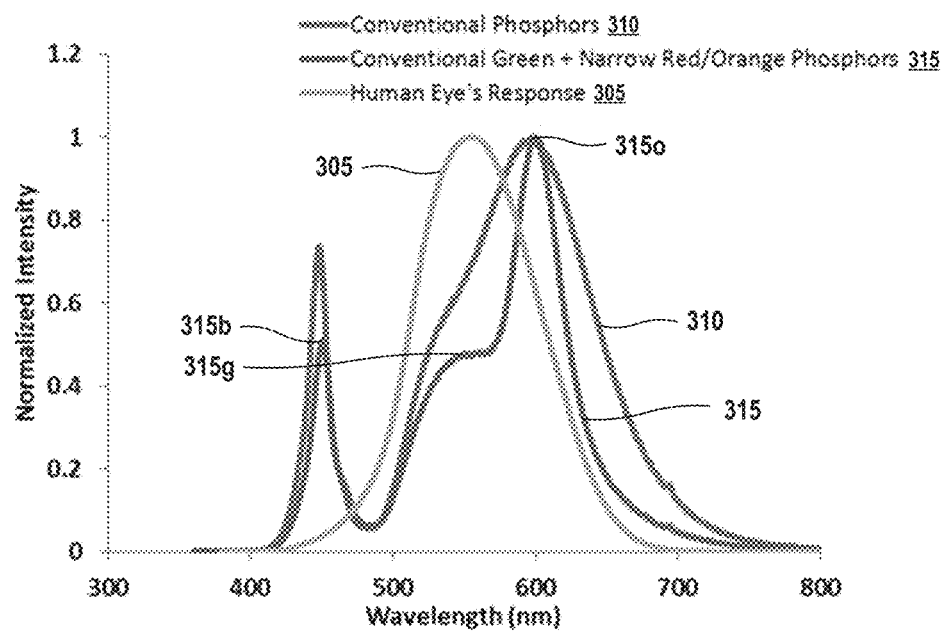
FIG. 3 is a graph illustrating emission spectra of a conventional semiconductor light emitting device and a semiconductor light emitting device including at least one narrow-spectrum luminescent material for providing warm white light output according to some embodiments of the present disclosure.

FIG. 3 illustrates output spectra 310, 315 of light emitting devices including warm white LEDs at 3000 K with CRI>70 in two configurations. The line 310 represents the spectrum of light output from a warm white LED including a conventional broad-spectrum red-emitting phosphor. The line 315 represents the spectrum of light output from a light emitting device according to some embodiments of the present disclosure, which includes a broad-spectrum green phosphor and a narrow-spectrum red/orange luminescent material, such as the CdSe/CdS/ZnS QDs discussed above, but is free of broad-spectrum luminescent materials that emit light having an emission peak in the red wavelength range, which can negatively affect the luminous efficacy of the light output 315. The line 305 represents the sensitivity of the human eye to color.

As shown in FIG. 3, the light output 315 of the light emitting device according to some embodiments of the present disclosure is free of emission peaks beyond about 700 nanometers, and includes an emission peak 315b in the blue wavelength range, an emission peak 315g in the green wavelength range, and an emission peak 315o in the orange wavelength range. The emission peak 315o in the orange wavelength range is between 590 nm to 609 nm, which is within about 50 nanometers or less of the emission peak in the green wavelength range. More particularly, the emission peak 315o is at about 600 nm, and the emission peak 315g is at about 555 nm (which substantially corresponds with the emission peak of the human eye sensitivity curve 305). The light output 315 of the light emitting device according to some embodiments of the present disclosure is also free of emission peaks between the emission peak 315g in the green wavelength range and the emission peak 315o in the orange wavelength range.

Figure 4:
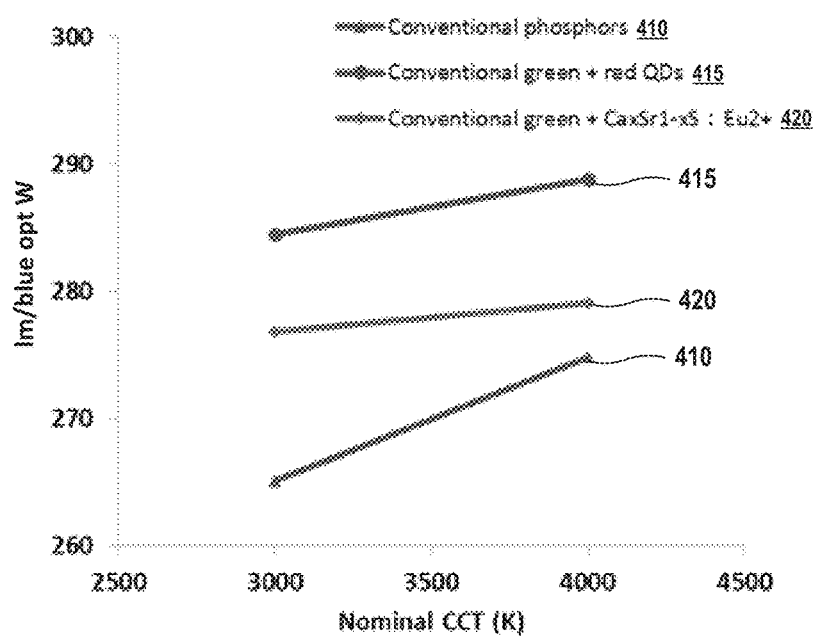
FIG. 4 is a graph illustrating efficacy gains of semiconductor light emitting devices including various combinations of narrow-spectrum luminescent materials for providing warm white light output according to some embodiments of the present disclosure at different color temperatures.

The efficacy gains of three warm white LEDs at different nominal CCTs are shown in FIG. 4. In particular, FIG. 4 illustrates luminous efficacy gains for a warm white LED including a conventional broad-spectrum red-emitting phosphor (represented by line 410), a light emitting device according to some embodiments of the present disclosure that includes a broad-spectrum green phosphor and a narrow-spectrum red/orange quantum dot material such as CdSe/CdS/ZnS (represented by line 415), and a light emitting device according to some embodiments of the present disclosure that includes a broad-spectrum green phosphor and a narrow-spectrum red/orange phosphor material such as $Ca_xSr_{1-x}S:Eu^{2+}$ (represented by line 420). As noted above, the light emitting devices according to some embodiments of the present disclosure are free of broad-spectrum luminescent materials that emit light having an emission peak in the red wavelength range. As shown by lines 415 and 420 in FIG. 4, the use of narrow-spectrum luminescent materials without broad-spectrum red-emitting luminescent materials can provide warm white light output with improved system efficacy (of greater than 280 lm/blue-optW and greater than 275 lm/blue-optW, respectively) as compared to the warm white LED including a conventional broad-spectrum red-emitting phosphor shown by line 410, over a color temperature range of 3000 K to 4000 K.

Figure 5A:
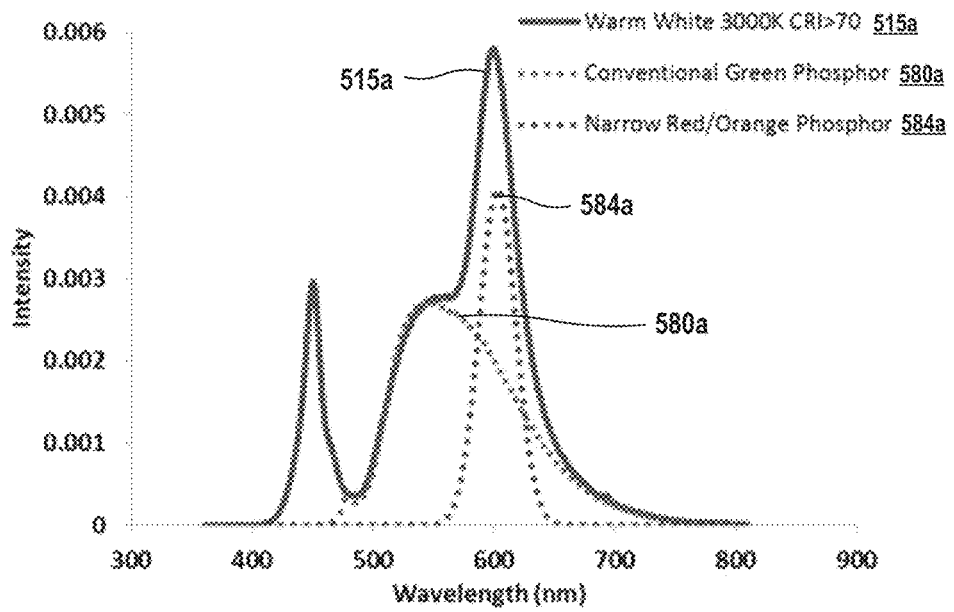
FIGS. 5A and 5B is a graph illustrating output spectra for semiconductor light emitting devices and component luminescent materials thereof for providing warm white light output according to some embodiments of the present disclosure at 3000 K and 4000 K, respectively.
Figure 5B:
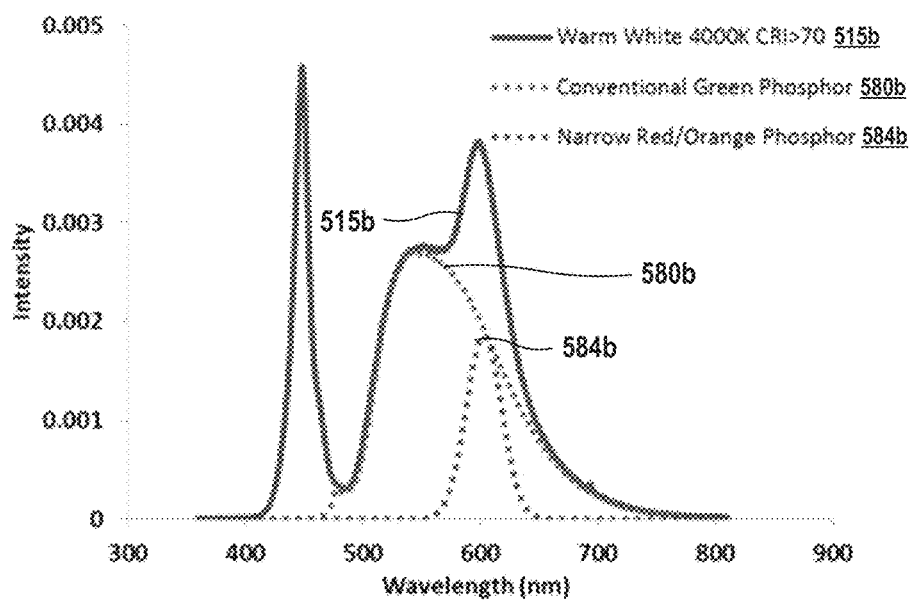

Also, some light emitting devices according to embodiments of the present disclosure may include different relative quantities of the narrow-spectrum red/orange-emitting luminescent materials and broad-spectrum green/yellow-emitting luminescent materials to provide warm white light output at different color temperatures. FIGS. 5A and 5B illustrate output spectra 515a, 580a, 584a and 515b, 580b, 584b for light emitting devices and component luminescent materials thereof targeting a CRI of greater than 70 at a nominal CCTs of 3000 K and 4000 K, respectively. The light emitting devices include two example recipes created using a blend of narrow-spectrum red/orange-emitting QDs and broad-spectrum green/yellow-emitting phosphors as down-converters for light provided by a blue-emitting LED, both of which are free of broad-spectrum luminescent materials that emit light having an emission peak in the red wavelength range. The output spectra 515a and 515b shown in FIGS. 5A and 5B are provided by light output from light emitting devices targeting a CRI of greater than 70 at a nominal CCT of 3000 K (E7 bins; represented by line 515a) and 4000 K (E5 bins; represented by line 515b), respectively. CdSe/CdS/ZnS QDs may be used as the narrow-spectrum red/orange-emitting QDs in some embodiments.

As shown in FIGS. 5A and 5B, the wavelength range of the emission spectra of the narrow-spectrum red/orange-emitting QDs 584a, 584b substantially or completely overlaps with that of the emission spectra of the broad-spectrum green/yellow-emitting phosphors 580a, 580b. For example, both the peak and the FWHM range (the bandwidth of the spectra 584a and 584b measured between points which are half the maximum amplitude) of the narrow-spectrum emission of the red/orange-emitting QDs 584a and 584b (having FWHM of less than 40 nm) fall within the wavelength ranges of the broad-spectrum emission of the green/yellow-emitting phosphors 580a and 580b, respectively. The spectra of the narrow-spectrum red/orange-emitting QDs 584a, 584b have respective emission peaks between 590-609 nm (for example, at about 603 nm), which is within about 50 nm of the emission peaks of the spectra of the green/yellow-emitting phosphors 580a, 580b. The light output 515a, 515b is free of emission peaks between the emission peaks in the green wavelength range and the emission peaks in the orange wavelength range, and is free of any emission peaks of more than about 5% of the total spectral power beyond about 700 nanometers. In some embodiments, the light output 515a, 515b may be free of emission peaks of more than about 5% of the total spectral power beyond about 610 nm, or even beyond about 600 nm. As also shown in FIGS. 5A and 5B, the relative quantities of the red/orange-emitting QDs and green/yellow-emitting phosphors can be adjusted to provide different relative intensities, depending on the desired CCT of the light output 515a, 515b.

Figure 6:
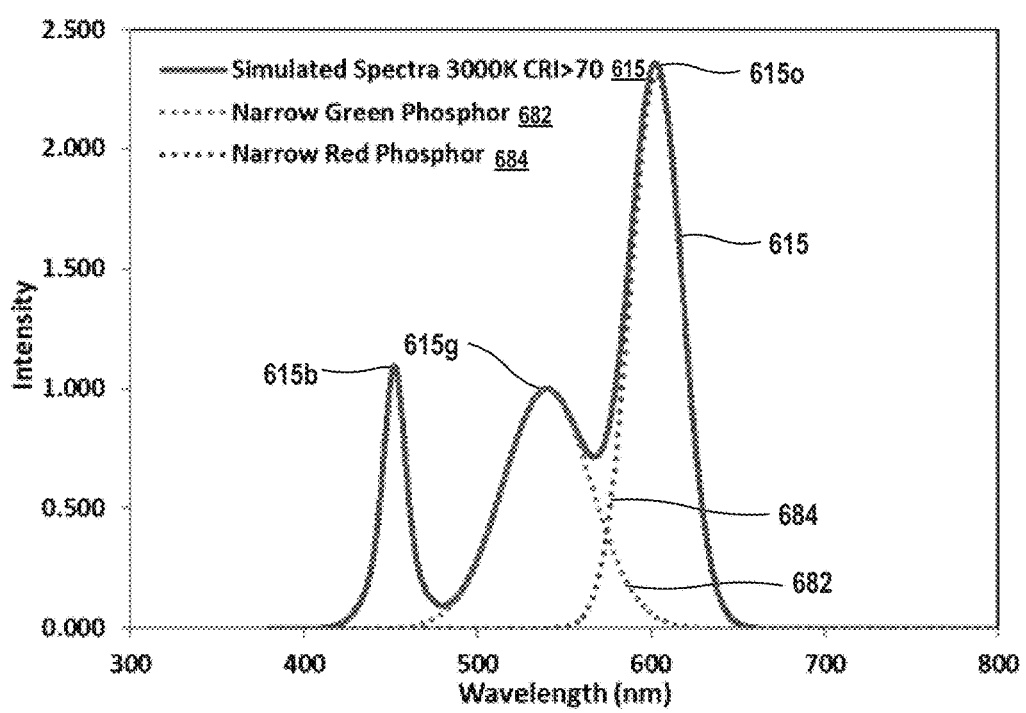
FIG. 6 is a graph illustrating output spectra for semiconductor light emitting devices and component luminescent materials thereof for providing warm white light output according to some further embodiments of the present disclosure at 3000 K.

Some further light emitting devices according to embodiments of the present disclosure may include a combination of narrow-spectrum red/orange-emitting luminescent materials and narrow-spectrum green/yellow-emitting luminescent materials to provide white light output, without broad-spectrum luminescent materials that emit light in the red wavelength range. FIG. 6 illustrates output spectra 615, 682, 684 of a light emitting device and component luminescent materials thereof targeting a CRI of greater than 70 at a CCT of 3000 K. The light emitting device includes a narrow-spectrum red/orange-emitting phosphor or quantum dot material and a narrow-spectrum green/yellow-emitting phosphor or quantum dot material as down-converters for light provided by a blue-emitting LED, but is free of broad-spectrum red-emitting luminescent materials.

As shown in FIG. 6, the light output 615 includes an emission peak 615b in the blue wavelength range, an emission peak 615g in the green wavelength range, and an emission peak 615o in the orange wavelength range. The emission spectra of the narrow-spectrum red/orange-emitting luminescent material 684 and the emission spectra of the narrow-spectrum green/yellow-emitting luminescent material 682 have respective peaks 615o and 615g and FWHM values that are free of overlap. In particular, the narrow-spectrum red/orange-emitting luminescent material 684 has an emission peak 615o between 590 nm to 609 nm (shown at about 603 nm), which is within about 75 nm of the emission peak 615g of the green/yellow-emitting luminescent material 682 between 520 and 560 nm (shown at about 540 nm). In the example of FIG. 6, the narrow-spectrum emission of the red/orange-emitting luminescent material 684 (having a FWHM of less than 40 nm) is substantially outside the wavelength range of the narrow-spectrum emission of the green/yellow-emitting luminescent material 682 (having a FWHM of about 60 nm or less), thereby reducing or minimizing overlap between the emission spectra 684 and 682. For example, both the peak and the FWHM range (the bandwidth of the spectra 684 measured between points which are half the maximum amplitude) of the narrow-spectrum emission of the red/orange-emitting luminescent material 684 fall outside the wavelength range of the narrow-spectrum emission of the green/yellow-emitting luminescent material 682.

The light output 615 is free of emission peaks of more than about 5% of the total spectral power beyond about 600 nanometers, and is free of essentially any emission beyond about 650 nm. The light output 615 is also free of emission peaks between the emission peak 615g in the green wavelength range and the emission peak 615o in the orange wavelength range. The combination of the reduction of emission into infrared wavelength range (improving the spectral output relative to the human eye response) and the reduction of overlap between the narrow-spectrum emission may improve luminous efficacy.

Example light emitting device structures including various combinations of narrow-spectrum luminescent materials and LEDs that provide white light output according to some embodiments of the present disclosure will now be described with reference to FIGS. 2A-2G. In the embodiments of FIGS. 2A-2G, each of the illustrated light emitting devices 200a-200f is free of broad-spectrum luminescent materials that emit light having an emission peak in a red wavelength range, which, as noted above, can negatively affect system efficacy. The recipient luminophoric media 285a-285g may include blended or multiple separated layers (illustrated by dashed lines), and each layer may include single or multiple luminescent materials (illustrated by dots of different sizes and shapes).

Figure 2A:
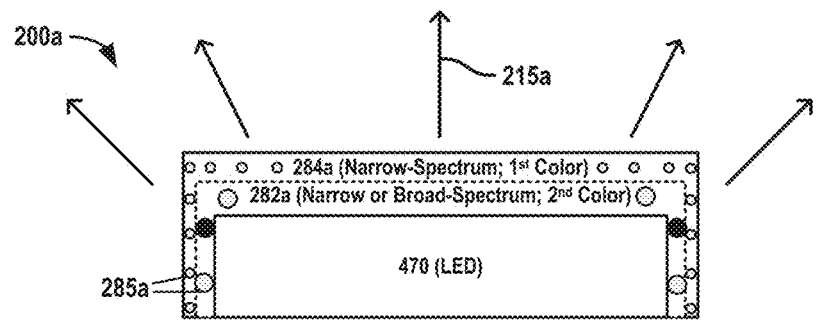
FIGS. 2A-2G are block diagrams illustrating semiconductor light emitting devices including various combinations of narrow-spectrum luminescent materials for providing white light output according to some embodiments of the present disclosure.

Referring now to FIG. 2A, a light emitting device 200a according to some embodiments of the present disclosure includes an LED 470 and a recipient luminophoric medium 285a. The recipient luminophoric medium 285a includes at least one narrow-spectrum luminescent material 282a, 284a, which may be blended or mixed in one layer, may be multiple stacked layers or materials, or may be a combination of mixed and stacked layers. The luminescent material(s) 282a, 284a are arranged to absorb portions of the light emitted by the LED and responsively emit light of one or more wavelength ranges that is longer than that of the light emitted by the LED 470, such that the combination of the unabsorbed or remaining light emitted by the LED 470 and the light responsively emitted by the luminescent material(s) 282a, 284a provides an appearance of white light output 215a. In particular, the LED 470 may be configured to emit light of a first color, the luminescent material 282a may be configured to convert a portion of the light emitted by the LED 470 to narrow-spectrum (<70 nm FWHM) or broad-spectrum (>70 nm FWHM) light of a second color having a longer wavelength than the first color, and the luminescent material 284a may be configured to convert a portion of the light emitted by the LED 470 and/or by the luminescent material 282a to narrow-spectrum light of a third color having a longer wavelength than the first color and/or the second color. For example, the LED 470 may be a blue-emitting LED (such as a GaN-based LED), the luminescent material 282a may be a narrow- or broad-spectrum green-emitting phosphor or quantum dot material (such as Ce-doped garnet or green perovskite QDs), and the luminescent material 284a may be a narrow-spectrum red-emitting quantum dot material (such as CdSe/CdS/ZnS) that emits light with a FWHM of less than about 40 nm. The light output 215a of the light emitting device 200a may be represented by the spectra 315, 515a, 515b, or 615 shown in FIG. 3, 5A, 5B, or 6, depending on the materials selected for the LED 470, and the compositions and/or relative quantities of the luminescent material(s) 282a, 284a.

As the device 200a does not include red-emitting broad-spectrum luminescent materials, efficacy loss, especially of the long-red portion of the spectrum, can be reduced or suppressed, enabling LER and efficacy gains. Further LER and efficacy gains may be achieved by the use of multiple narrow-spectrum luminescent materials that are selected to reduce or minimize cross-talk or overlap between their respective narrow-spectrum light emissions, such as the luminescent materials 282c and 284c discussed below with reference to FIG. 2C.

Figure 2B:
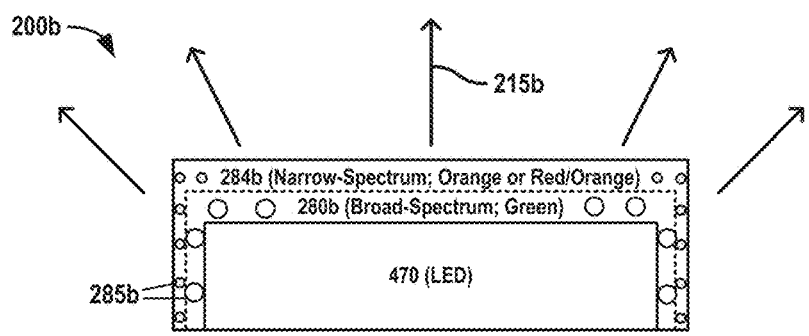

Referring now to FIG. 2B, a light emitting device 200b according to some further embodiments of the present disclosure includes an LED 470 and a recipient luminophoric medium 285b. The recipient luminophoric medium 285b includes at least one broad-spectrum luminescent material 280b and at least one narrow-spectrum luminescent material 284b, which may be blended or mixed in one layer, may be multiple stacked layers or materials, or may be a combination of mixed and stacked layers. The luminescent materials 280b, 284b are arranged to absorb portions of the light emitted by the LED 470 and responsively emit light of wavelengths that are longer than that of the light emitted by the LED 470, such that the combination of the unabsorbed or remaining light emitted by the LED 470 and the light responsively emitted by the luminescent material(s) 280b, 284b provides an appearance of warm white light output 215b. In particular, the LED 470 may be configured to emit blue light, the luminescent material 280b may be configured to convert a portion of the blue light emitted by the LED 470 to broad-spectrum (>70 nm FWHM) green light, and the luminescent material 284b may be configured to convert a portion of the blue light emitted by the LED 470 (and/or the green light by the luminescent material 280b) to narrow-spectrum orange or red/orange light. For example, the LED 470 may be a blue-emitting LED (such as a GaN-based LED), the luminescent material 280b may be one or more broad-spectrum green-emitting and/or green/yellow-emitting phosphors (such as Ce-doped garnet), and the luminescent material 284b may be a narrowband emitter having a peak wavelength shifted towards the orange end of the visible spectrum (such as CdSe/CdS/ZnS), which provides a more compact emission spectrum as compared to a conventional broad-spectrum red phosphor.

The warm white light output 215b of the light emitting device 200b may be represented by the spectra 515a and 515b with nominal CCTs of 3000 K and 4000 K shown in FIGS. 5A and 5B, respectively. Referring again to FIGS. 5A and 5B, the CCT of the light output 215b may depend on the relative quantities of the green-emitting and red-emitting luminescent materials 280b and 284b and the resulting relative spectral compositions of the output light. As used herein, spectral composition may refer to the integrated power intensity of each specific color (blue:green:red/orange) as fitted from the spectrum of the individual LED or luminescent material. Approximate spectral composition ratios resulting in the 4000 K and 3000 K warm white light output 215b are listed in Table 1. The spectral composition ratios shown in Table 1 illustrate the relative decrease in red wavelength range emission of light emitting devices 200b including narrow-spectrum red/orange-emitting luminescent materials described herein, as compared to light emitting devices including conventional broad-spectrum red-emitting phosphors, for both 3000 K and 4000 K warm white light.

TABLE 1

| | CCT 4000 K | | CCT 3000 K | |
| --- | --- | --- | --- | --- |
| | Phosphor composition | | | |
| | Broad-Spectrum red + Broad-Spectrum green | Narrow-Spectrum red/orange + Broad-Spectrum green | Broad-Spectrum red + Broad-Spectrum green | Narrow-Spectrum red/orange + Broad-Spectrum green |
| Spectral composition ratio (blue:green:red/orange) | 1:3.5:1.1 | 1:3.5:0.7 | 1:4.9:3.5 | 1:5.0:2.3 |

In some embodiments, the green-emitting and red-emitting luminescent materials 280b and 284b are mixed or otherwise combined based on the desired composition in each recipe and encapsulated in silicone to define a recipient luminophoric medium that can be applied to the LED 470. For example, a specific volume of the recipient luminophoric medium including respective amounts the green-emitting and red-emitting luminescent materials 280b and 284b for the desired spectral composition ratio can be dispensed on a blue LED package 470 to provide emission of warm white light at the designated color target.

Tables 2 and 3 illustrate comparisons of LER, efficacy (lm/blue-optW), and CRI between some conventional devices including broad-spectrum green- and red-emitting phosphors and the light emitting device 200b including a green-emitting broad-spectrum luminescent material 280b and a orange/red-emitting narrow-spectrum luminescent material 284b. In particular, Tables 2 and 3 illustrate efficacy (lm/blue-optW) and LER for light output with a CRI of about 70, at CCTs of 4000 K and 3000 K, respectively. As shown in Tables 2 and 3, the device 200b can achieve about 5% efficacy gain (exceeding 285 lm/blue-optW) and about 5% LER gain (exceeding 360 lm/W-optical) at 4000 K, and about 7% efficacy gain (exceeding 280 lm/blue-optW) and about 9% LER gain (exceeding 380 lm/W-optical) at 3000 K over conventional devices. That is, some embodiments of the present disclosure may allow for higher efficiency gains at lower/warmer color temperatures of the output light.

Figure 2C:
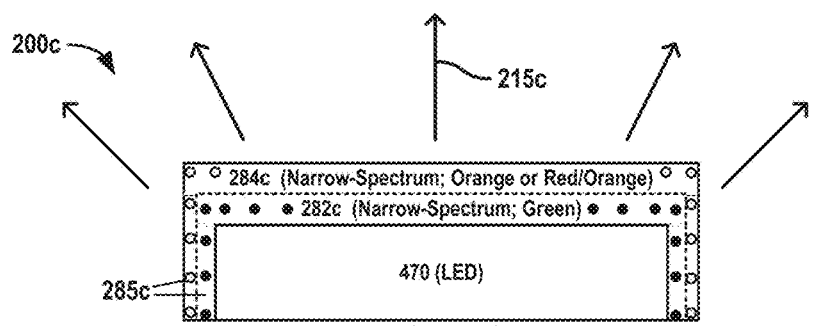

Referring now to FIG. 2C, a light emitting device 200c according to yet further embodiments of the present disclosure includes an LED 470 and a recipient luminophoric medium 285c. The recipient luminophoric medium 285c includes a narrow-spectrum luminescent material 282c and a narrow-spectrum luminescent material 284c, which may be blended or mixed in one layer, may be multiple stacked layers or materials, or may be a combination of mixed and stacked layers. The luminescent materials 282c, 284c are arranged to absorb portions of the light emitted by the LED 470 and responsively emit light of wavelengths that are longer than that of the light emitted by the LED 470, such that the combination of the unabsorbed or remaining light emitted by the LED 470 and the light responsively emitted by the narrow-spectrum luminescent material(s) 282c, 284c provides an appearance of warm white light output 215c. In particular, the LED 470 may be configured to emit blue light, the luminescent material 282c may be configured to convert a portion of the blue light emitted by the LED 470

TABLE 2

| CCT 4000 K | Red phosphor | Green phosphor | Efficacy (lm/blue-optW) | LER | CRI |
| --- | --- | --- | --- | --- | --- |
| Broad-Spectrum red and green | Nitride with peak > 610 nm and FWHM > 70 nm | Ce-doped garnet | 274.8 | 348.2 | 71.7 |
| Narrow-Spectrum red and Broad-Spectrum green | CdSe/CdS/ZnS QDs | Ce-doped garnet | 288.8 (+5.2%) | 364.7 (+4.7%) | 71.3 (−0.4) |

TABLE 3

| CCT 3000 K | Red phosphor | Green phosphor | Efficacy (lm/blue-optW) | LER | CRI |
| --- | --- | --- | --- | --- | --- |
| Broad-Spectrum red and green | Nitride with peak > 610 nm and FWHM > 70 nm | Ce-doped garnet | 265.1 | 351.9 | 71.9 |
| Narrow-Spectrum red and Broad-Spectrum green | CdSe/CdS/ZnS QDs | Ce-doped garnet | 284.5 (+7.1%) | 382.2 (+8.6%) | 69.9 (−2.0) | to narrow-spectrum (<70 nm FWHM) green light, and the luminescent material 284c may be configured to convert a portion of the blue light emitted by the LED 470 (and/or the green light by the luminescent material 282c) to narrow-spectrum orange or red/orange light (<40 nm FWHM). For example, the LED 470 may be a blue-emitting LED (such as a GaN-based LED), the luminescent material 282c may be a narrow-spectrum green-emitting phosphor or quantum dot material (such as Ce-doped garnet or green perovskite QDs), and the luminescent material 284c may be a narrow-spectrum orange- or red/orange-emitting phosphor or quantum dot material (such as CdSe/CdS/ZnS).

The warm white light output 215c of the light emitting device 200b may be represented by the spectra 615 with a nominal CCT of 3000 K shown in FIG. 6. Referring again to FIG. 6, the narrow-spectrum green-emitting phosphor 282c has an emission peak at about 540 nm with a FWHM of about 60 nm, while the narrow-spectrum red/orange-emitting quantum dot material 284c has an emission peak at about 603 nm with FWHM of about 36 nm. Both of the narrow-spectrum luminescent materials 282c, 284c thus provide light emission having a more compact spectrum compared to conventional broad-spectrum green and red phosphors, respectively.

Table 4 illustrates comparisons of LER, efficacy (lm/blue-optW), and CRI between some conventional devices including broad-spectrum green- and red-emitting phosphors and the light emitting device 200c including a green-emitting narrow-spectrum luminescent material 282c and a red-emitting narrow-spectrum luminescent material 284c for light output with a CRI of about 70 at a CCT of 3000 K. The gains are simulated using the same luminescent material as the spectra 615 in FIG. 6. As shown in Table 4, the device 200c can achieve about 13% efficacy (lm/blue-optW) gain and about 16% LER gain over conventional devices.

As noted above, the combination of multiple narrow-spectrum luminescent materials 282c, 284c may thus allow for reduced overlap between their respective output emission spectra 682, 684. In particular, the further inclusion of a narrow-spectrum green-emitting luminescent material 282c in combination with a narrow-spectrum red-emitting luminescent material 284c can further increases the LER and efficacy (lm/blue-optW) gains due not only to reduction or elimination of emission into infrared wavelength range (improving the spectral output relative to the human eye response), but also due to reduction of cross-talk or overlap between the emission of each of the luminescent materials 282c, 284c. The use of multiple narrow-spectrum luminescent materials 282c, 284c may also allow for a tighter or more compact overall output spectrum 615. In the example of FIG. 2C, the light output 215c may be free of emission at wavelengths less than about 400 nm, and at wavelengths greater than about 650 nm in some embodiments.

Table 5 provides a summary of luminescent material combinations and corresponding spectral compositions of the light output 215b and 215c provided by the devices 200b and 200c described above with reference to FIGS. 2B and 2C, respectively, as compared to some conventional devices including broad-spectrum green- and red-emitting phosphors. The spectral composition ratios shown in Table 5 illustrate the relative increase in red wavelength range emission and decrease in green wavelength range emission of light emitting devices 200c including narrow-spectrum green- and red/orange-emitting luminescent materials as compared to light emitting devices including conventional broad-spectrum green- and red-emitting phosphors, for both 3000 K and 4000 K warm white light.

TABLE 4

| CCT 3000 K | Red phosphor | Green phosphor | Efficacy (lm/blue-optW) | LER | CRI |
|---|---|---|---|---|---|
| Broad-Spectrum red and green | Nitride with peak ~610 nm and FWHM > 70 nm | Ce-doped garnet | 265.1 | 351.9 | 71.9 |
| Narrow-Spectrum red and green | Simulated Red QDs with peak 603 nm and FWHM 36 nm | Simulated green QDs with peak 540 nm and FWHM 60 nm | 300.6 (+13.4%) | 408.9 (+16.2%) | 71.2 |

TABLE 5

|  | CCT 4000 K | | | CCT 3000 K | | |
|---|---|---|---|---|---|---|
|  | Phosphor composition | | | | | |
|  | Broad-Spectrum green + Broad-Spectrum red | Broad-Spectrum green + Narrow-Spectrum red/orange | Narrow-Spectrum green + Narrow-Spectrum red/orange | Broad-Spectrum green + Broad-Spectrum red | Broad-Spectrum green + Narrow-Spectrum red/orange | Narrow-Spectrum green + Narrow-Spectrum red/orange |
| Spectral composition ratio blue:green:red | 1:3.5:1.1 | 1:3.5:0.7 | 1:2.0:1.9 | 1:4.9:3.5 | 1:5.0:2.3 | 1:2.9:4.0 |

Figure 2D:
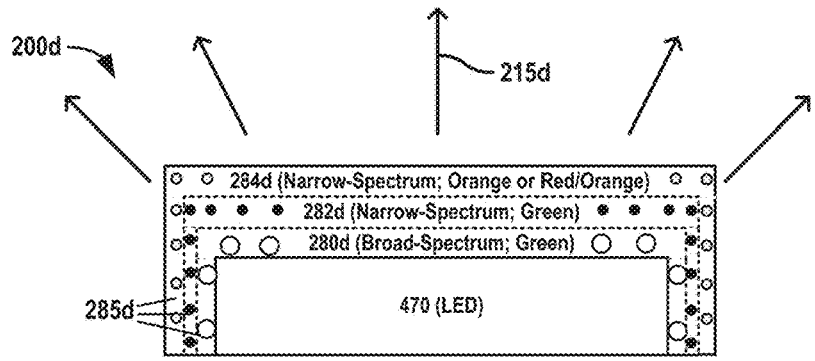

Referring now to FIG. 2D, a light emitting device 200d according to some still further embodiments of the present disclosure includes an LED 470 and a recipient luminophoric medium 285d. The recipient luminophoric medium 285d includes a broad-spectrum luminescent material 280d, a first narrow-spectrum luminescent material 282d, and a second narrow-spectrum luminescent material 284d, which may be blended or mixed in one layer, may be multiple stacked layers or materials, or may be a combination of mixed and stacked layers. The luminescent materials 280d, 282d, 284d are arranged to absorb portions of the light emitted by the LED 470 and responsively emit light of wavelengths that are longer than that of the light emitted by the LED 470, such that the combination of the unabsorbed or remaining light emitted by the LED 470 and the light responsively emitted by the luminescent materials 280d, 282d, and 284d provides an appearance of warm white light output 215d. In particular, the LED 470 may be configured to emit blue light, the luminescent material 280d may be configured to convert a portion of the blue light emitted by the LED 470 to broad-spectrum (>70 nm FWHM) green light, the luminescent material 282d may be configured to convert a portion of the blue light emitted by the LED 470 to narrow-spectrum (<70 nm FWHM) green light, and the luminescent material 284d may be configured to convert a portion of the blue light emitted by the LED 470 (and/or the green light by the luminescent materials 280d, 282d) to narrow-spectrum orange or red/orange light (<40 nm FWHM). For example, the LED 470 may be a blue-emitting LED (such as a GaN-based LED), the luminescent material 280d may be a broad-spectrum green-emitting phosphor (such as Ce-doped garnet), the luminescent material 282d may be a narrow-spectrum green-emitting phosphor or quantum dot material (such as perovskite QDs), and the luminescent material 284d may be a narrow-spectrum orange- or red/orange-emitting phosphor or quantum dot material (such as CdSe/CdS/ZnS).

Thus, by removing the broad-spectrum red-emitting luminescent materials, various combinations of broad- and/or narrow-spectrum luminescent materials that emit light in the green/yellow wavelength ranges can be used with narrow-spectrum luminescent materials that emit light in the red/orange wavelength ranges to achieve LER and efficacy (lm/blue-optW) gains at CRI>70. Table 6 provides a summary of general characteristics of such narrow-spectrum luminescent material combinations that may allow for gains in LER and efficacy for CRI>70 at different CCTs in accordance with some embodiments of the present disclosure. As shown in Table 6, narrow-spectrum red/orange-emitting luminescent material may emit light having peak emission between about 595 nm to about 625 nm (for example, between 598 nm and 602 nm), with a FWHM of 40 nm or less, with converter efficiency of up to about 95% and luminous efficacy that generally increases as CCT decreases. The parameters listed green phosphors are based on relatively ranges, in which the number of green phosphors, emission centroids, and FWHM may be selected based on the choice of red phosphor.

TABLE 6

| Parameter | | Nominal CCT (K) | Peak position (nm) | FWHM (nm) | Converter quantum yield | Emission Centroid (nm) | Effic. gain |
|---|---|---|---|---|---|---|---|
| Green Phosphor(s) | General | 3000-4000 | Could be one or multiple | — | — | 520-560 | — |
| Red Phosphor | some embodiments | 3000-4000 | 595-625 | ≤40 | 86% | — | >0 |
|  | further embodiments | 3000 | 600-612 | ≤36 | 86% | — | >13% |
|  |  | 3500 | 600-615 | ≤36 | 86% | — | >11% |
|  |  | 4000 | 598-615 | ≤36 | 86% | — | >10% |
|  | embodiments with conventional green phosphor | 3000 | 602 | 10 | 95% | — | 15% |
|  |  | 3500 | 600 | 10 | 95% | — | 12% |
|  |  | 4000 | 598 | 15 | 95% | — | 11% |
|  | embodiments with narrow green phosphor(s) | 3000 | 600 | 10 | 95% | — | 26% |
|  |  | 3500 | 600 | 10 | 95% | — | 23% |
|  |  | 4000 | 598 | 10 | 95% | — | 21% |

While some embodiments have been described above with reference to output light having a target CRI of about 75 or about 70, efficiency of light emitting devices according to embodiments of the present disclosure can be further improved by reducing CRI requirements to less than about 70, which may be acceptable for some outdoor lighting applications. For example, embodiments of the present disclosure may provide light output having a CRI of less than about 65 some embodiments, or even less than about 50 in some embodiments.

Figure 2E:
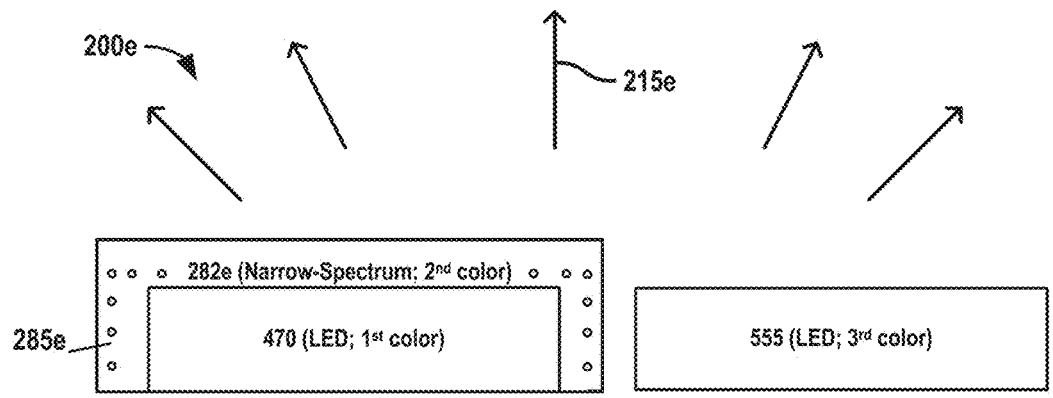

Referring now to FIG. 2E, still further embodiments of the present disclosure may include a combination of multiple single-color-emitting LEDs with one or more narrow-spectrum luminescent materials. FIG. 2E illustrates a light emitting device 200e that includes a first LED 470 configured to emit light of a first color and a recipient luminophoric medium 285e. The recipient luminophoric medium 285e includes a narrow-spectrum luminescent material 282e, which may be blended or mixed with other materials in one layer, may be multiple stacked layers or materials, or may be a combination of mixed and stacked layers. The narrow-spectrum luminescent material 282e is arranged to absorb portions of the light emitted by the first LED 470 and responsively emit light of wavelengths that are longer than that of the light emitted by the first LED 470, and a second LED 555 configured to emit light of a second color that is different from the first color, such that the combination of the unabsorbed or remaining light emitted by the first LED 470, the light responsively emitted by the luminescent material 282e, and the light emitted by the second LED 555 provides an appearance of warm white light output 215e.

For example, the first LED 470 may be a GaN-based LED configured to emit blue light, the luminescent material 282e may be a narrow-spectrum green-emitting phosphor or quantum dot material (such as perovskite QDs) configured to convert a portion of the blue light emitted by the first LED 470 to narrow-spectrum (<60 nm FWHM) green light, and the second LED 555 may be configured to emit orange or red/orange light. As another example, the first LED 470 may be a GaN-based LED configured to emit blue light, the luminescent material 282e may be a narrow-spectrum orange- or red/orange-emitting phosphor or quantum dot material (such as CdSe/CdS/ZnS) configured to convert a portion of the blue light emitted by the first LED 470 to narrow-spectrum (<40 nm FWHM) orange or red/orange light, and the second LED 555 may be configured to emit green light.

It will be understood that embodiments of the present disclosure are not limited to blue-emitting LEDs in combination with narrow-spectrum luminescent materials. More generally, light emitting devices according to embodiments of the present disclosure may include various combinations of narrow converters and direct-emitters that are free of broad-spectrum red-emitting luminescent materials, allowing for improved luminous efficacy for light output with CRI values of less than 75, less than 70, less than 65, or less than 50. Further possible examples include blue LEDs, orange LEDs and blue-shifted-yellow (BSY) LEDs combined to have a desired CCT.

Figure 2F:
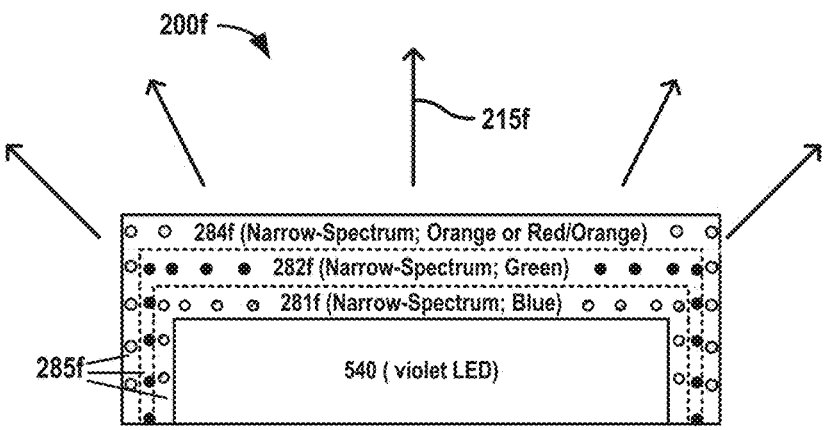

In some embodiments, rather than using a conventional blue-emitting LED 470, a LED that is configured to emit in a shorter wavelength may provide improved efficiency. Referring now to FIG. 2F, a light emitting device 200f according to yet further embodiments of the present disclosure includes a LED 540 and a recipient luminophoric medium 285f. The recipient luminophoric medium 285f includes a first narrow-spectrum luminescent material 281f, a second narrow-spectrum luminescent material 282f, and a third narrow-spectrum luminescent material 284f, which may be blended or mixed in one layer, may be multiple stacked layers or materials, or may be a combination of mixed and stacked layers. The luminescent materials 281f, 282f, 284f are arranged to absorb portions of the light emitted by the LED 540 and responsively emit light of wavelengths that are longer than that of the light emitted by the LED 540, such that the combination of the unabsorbed or remaining light emitted by the LED 540 and the light responsively emitted by the luminescent materials 281f, 282f, and 284f provides an appearance of warm white light output 215f. In particular, the LED 540 may be configured to emit violet or ultraviolet light, the luminescent material 281f may be configured to convert a portion of the violet or ultraviolet light emitted by the LED 540 to narrow-spectrum (<70 nm FWHM) blue light, the luminescent material 282f may be configured to convert a portion of the violet or ultraviolet light emitted by the LED 540 (and/or the blue light from material 281f) to narrow-spectrum (<70 nm FWHM) green light, and the luminescent material 284f may be configured to convert a portion of the violet or ultraviolet light emitted by the LED 540 (and/or the blue light from material 281f and/or the green light from material 282f) to narrow-spectrum orange or red/orange light (<40 nm FWHM). That is, the light emitting device 200f in the example of FIG. 2F includes a violet-emitting LED 540 (rather than a blue-emitting LED) in combination with at least one narrow-spectrum luminescent material 281f, 282f, 284f to provide warm white light output 215f.

Figure 2G:
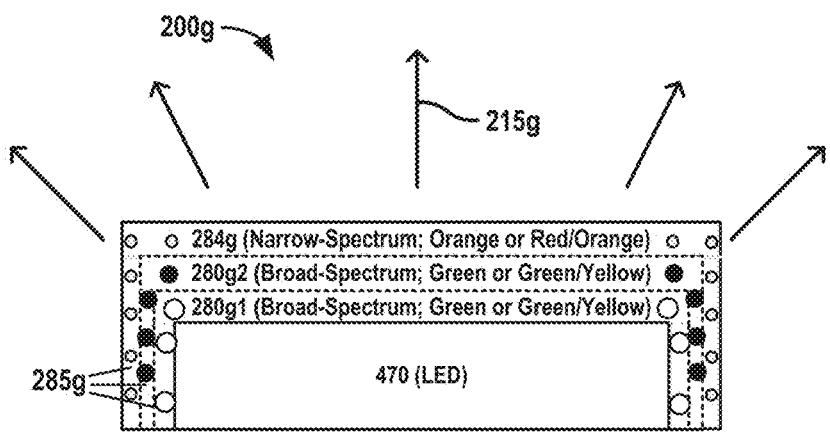

Referring now to FIG. 2G, a light emitting device 200g according to some still further embodiments of the present disclosure includes an LED 470 and a recipient luminophoric medium 285g. The recipient luminophoric medium 285g includes a first broad-spectrum luminescent material 280g1, a second broad-spectrum luminescent material 280g2, and a narrow-spectrum luminescent material 284g, which may be blended or mixed in one layer, may be multiple stacked layers or materials, or may be a combination of mixed and stacked layers. The luminescent materials 280g1, 280g2, 284g are arranged to absorb portions of light incident thereon and responsively emit light of wavelengths that are longer than that of the light emitted by the LED 470, such that the combination of the unabsorbed or remaining light emitted by the LED 470 and the light responsively emitted by the luminescent materials 280g1, 280g2, 284g provides an appearance of warm white light output 215g. In particular, the LED 470 may be configured to emit blue light, the luminescent material 280g1 may be configured to convert a portion of the incident light to broad-spectrum (>70 nm FWHM) green or green/yellow light, the luminescent material 280g2 may be configured to convert a portion of the incident light to broad-spectrum (>70 nm FWHM) green or green/yellow light, and the luminescent material 284g may be configured to convert a portion of the blue light emitted by the LED 470 (and/or the green light or green/yellow light emitted by the luminescent materials 280g1, 280g2) to narrow-spectrum orange or red/orange light (<40 nm FWHM). For example, the LED 470 may be a blue-emitting LED (such as a GaN-based LED), the luminescent material 280g1 may be a broad-spectrum green-emitting phosphor (such as Ce-doped garnet), the luminescent material 280g2 may be a different broad-spectrum green-emitting phosphor, and the luminescent material 284g may be a narrow-spectrum orange- or red/orange-emitting phosphor or quantum dot material (such as CdSe/CdS/ZnS).

Embodiments of the present disclosure may thus be aimed at applications where color fidelity is less important as compared to efficacy or brightness, such as outdoor lighting with CRI requirements of 75 or less. In particular examples, eliminating the broad-spectrum red-emitting luminescent materials from the device and using narrow-spectrum orange- or red/orange-emitting luminescent materials can allow for higher LER and efficacy (lm/blue-optW) gains for warmer CCT applications compared with cooler CCT.

FIGS. 7A-7I illustrate operations for forming a recipient luminophoric medium including at least one narrow-spectrum luminescent material as described above on a light emitting device according to further embodiments of the present disclosure. In the embodiments discussed with respect to FIGS. 7A-7I, a luminescent solution is applied to a singulated light emitting device 170 (here an LED chip) that is mounted on a substrate 160, for example, by spraying the luminescent solution onto a heated LED chip 170 to provide a recipient luminophoric medium 180 thereon.

The recipient luminophoric medium 180 may be a conformal layer. The luminescent solution may also and/or alternatively be applied to a lens 194 and/or a reflector cup 162 of the LED chip 170 to define the luminophoric medium 180, as discussed below. The luminescent solution may be applied in a similar manner to, for example, bare (i.e. unmounted) LED die and/or to LED wafers, which may be subsequently singulated to provide individual LED chips 170 with the luminophoric medium 180 thereon.

As mentioned above, the luminophoric medium 180 may include multiple materials, for example, an encapsulant that contains one or more luminescent materials, in a blended or separated multi-layer approach. The multi-layer approach may be useful to control re-absorption effects between different luminescent materials. For example, layering of the narrow-band red-emitting luminescent material in a layer below the green and yellow phosphors may prevent absorption of the yellow/green emission by the red-emitting luminescent material, or vice versa. Although illustrated herein with reference to particular numbers of layers and orders of layers in some embodiments, it will be understood that any number of layers may be used and in any desirable order. Alternatively, in a mixed system, complications of multiple layers can be avoided by incorporating multiple and/or all luminescent materials in a single layer. It should be appreciated that any narrow-band emitters and/or broad-band emitters can be incorporated in the manner described above.

As another alternative, the luminophoric medium 180 may include the luminescent material(s) without an encapsulant. For example, luminescent materials of different peak wavelengths can be combined either in separated multi-layers, a single blended layer, or a combination of both. The down-conversion of incident light by the luminescent materials can be tailored by changing various properties such as layer thickness, concentration of emitters, and/or combination of emitters, for example.

Figure 7A:
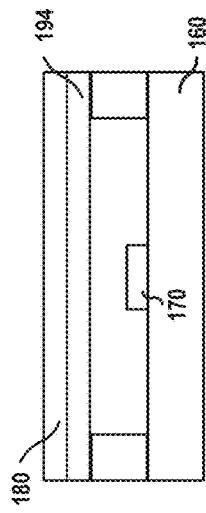
FIGS. 7A-7I are schematic diagrams that illustrate application of a recipient luminophoric medium to a semiconductor light emitting device according to some embodiments of the present disclosure.
Figure 7B:
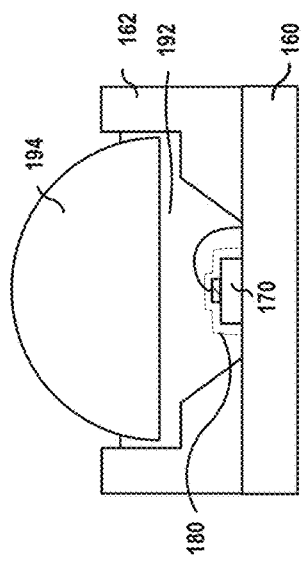
Figure 7C:
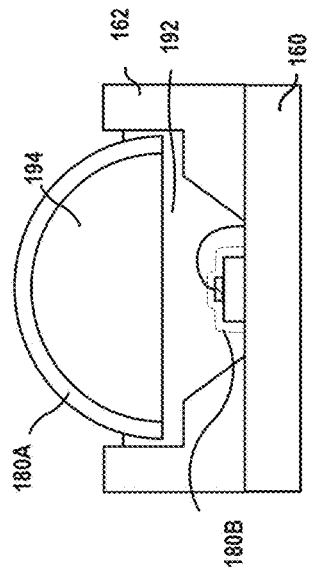
Figure 7D:
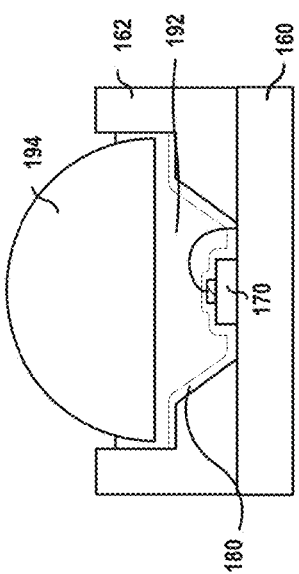
Figure 7E:
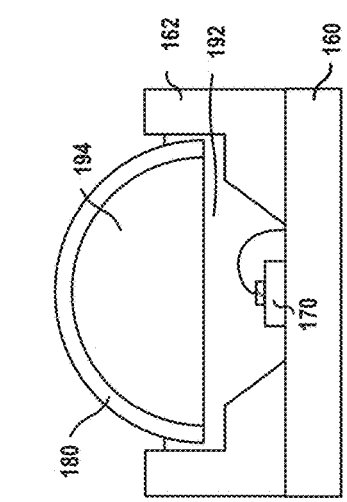

Referring to FIG. 7A, after the conformal recipient luminophoric medium 180 is formed on the LED, an encapsulant material 192, such as silicone and/or epoxy, can be dispensed to at least partially fill the optical cavity defined by the reflector cup 162, and a lens 194, such as a glass or silicone lens, can be positioned over the LED chip 170. As shown in FIG. 7B, pursuant to further embodiments, the luminescent solution may be sprayed onto both the LED chip 170 and the surrounding structure, such as, for example, the reflector cup 162 to form the recipient luminophoric medium 180 thereon. As shown in FIG. 7C, in still other embodiments, the recipient luminophoric medium 180 may be formed on an exterior and/or interior surface of the lens 194, which is heated to cause the recipient luminophoric medium 180 to cure. As shown in FIG. 7D, in still further embodiments, the recipient luminophoric medium 180 may be applied to a two-dimensional structure, such as, for example, a lens 194 or other transmissive and/or reflective optical element. In other embodiments, multiple of the above-described techniques may be used. By way of example, as shown in FIG. 7E, a first recipient luminophoric medium 180A may be applied to a heated lens 194 and a second recipient luminophoric medium 180B may be applied to the heated LED chip 170.

Figure 7F:
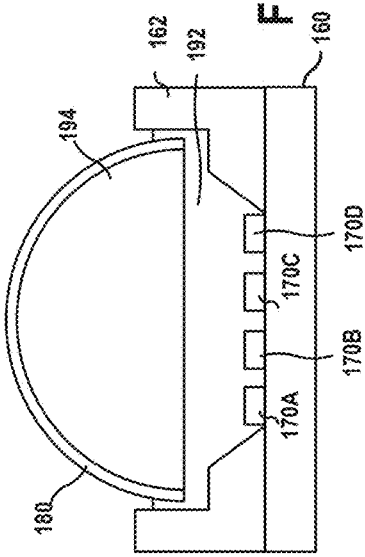
Figure 7G:
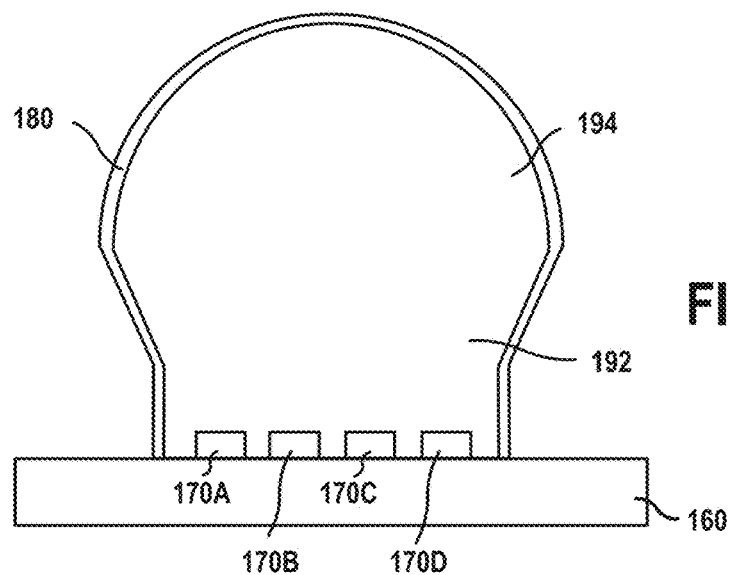
Figure 7H:
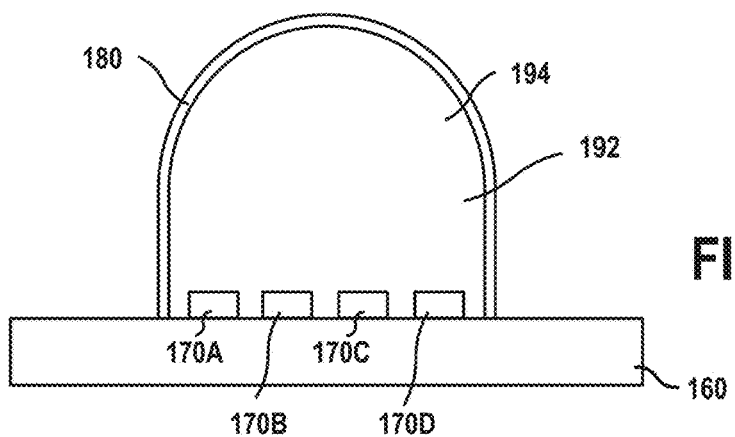
Figure 7I:
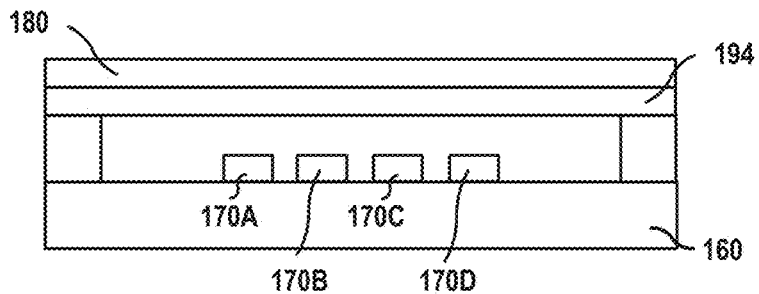

As shown in FIG. 7F, a recipient luminophoric medium 180 according to embodiments of the present disclosure may be formed on a light emitting device that includes multiple LED chips 170A-D. The LED chips 170A-D may be configured to emit light at one or more different peak wavelengths and/or combinations thereof. In the embodiment depicted in FIG. 7G, the recipient luminophoric medium 180 is provided on the outside of a lens 194. FIGS. 7H and 7I illustrate additional exemplary embodiments in which multiple LED chips 170A-D are provided inside a lens 194 that includes a recipient luminophoric medium 180 thereon.

In FIGS. 7A-7I, the recipient luminophoric medium 180 may include any of the above-described luminescent materials according to embodiments of the present disclosure, which include at least one narrow-spectrum luminescent material but do not include or are otherwise free of broad-spectrum red-emitting luminescent materials. As discussed above, the various luminescent materials included in the recipient luminophoric medium may all be mixed in a single layer or coating or may be provided in separate layers, where each layer includes one or more of the luminescent materials and perhaps other materials as well such as diffuser particles, binder materials, etc. Additional and/or intervening layers may also be provided. The different layers 180A and 180B of the recipient luminophoric medium 180 can include the same or different materials. By way of example, the first layer 180A may include a first luminescent material, and the second layer 180B may include the first luminescent material, a different second luminescent material and/or other elements (e.g., diffuser particles).

FIGS. 8A-8D illustrate an example semiconductor light emitting device 800 having a recipient luminophoric mediums that includes at least one narrow-spectrum luminescent material but is free of broad-spectrum red-emitting luminescent materials according to embodiments of the present disclosure. The device 800 is illustrated as a packaged lamp. FIG. 8A is a perspective view of the device 800 without a lens thereon. FIG. 8B is a perspective view of the device 800 viewed from the opposite side. FIG. 8C is a side view of the device 800 with a lens covering the LED chip. FIG. 8D is a bottom perspective view of the device 800.

As shown in FIG. 8A, the device 800 includes a submount 32 on which a single LED chip or "die" 34 is mounted. The submount 32 can be formed of many different materials such as, for example, aluminum oxide, aluminum nitride, organic insulators, a printed circuit board (PCB), sapphire or silicon. The LED 34 may be an ultraviolet, violet or blue LED that emits radiation with a peak wavelength in a range of about 380 nm to about 475 nm. The LED 34 may include at least one active layer/region sandwiched between oppositely doped epitaxial layers. The LED 34 may be grown on a growth substrate to provide a grown semiconductor wafer, and this wafer may then be singulated into individual LED dies to provide the LED 34. The growth substrate can remain as part of the final singulated LED 34 or can be fully or partially removed. The LED 34 may include additional layers and elements that are not shown in FIGS. 8A-8D including, for example, nucleation layers, light extraction layers and/or light extraction elements. The oppositely doped layers can comprise multiple layers and sub-layers, as well as super lattice structures and interlayers. The active region can include, for example, single quantum well (SQW), multiple quantum well (MOW), double heterostructure and/or super lattice structures. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 34 may include a conductive current spreading structure 36 on its top surface, as well as one or more contacts 38 that are accessible at its top surface for wire bonding. The current spreading structure 36 and contacts 38 can be made of a conductive material such as Au, Cu, Ni, In, Al, Ag or combinations thereof, conducting oxides and transparent conducting oxides. The current spreading structure 36 may comprise spaced-apart conductive fingers 37 that are arranged to enhance current spreading from the contacts 38 into the top surface of the LED 34. In operation, an electrical signal is applied to the contacts 38 through a wire bond, and the electrical signal spreads through the fingers 37 of the current spreading structure 36 into the LED 34.

The LED 34 may be coated with a recipient luminophoric medium 39 that includes at least one narrow-spectrum luminescent material but is free of broad-spectrum red-emitting luminescent materials according to any of the embodiments of the present disclosure. As discussed above, this recipient luminophoric medium 39 may include one or more narrow-spectrum luminescent materials that absorb some of the light emitted by the LED 34 and emit light in a different wavelength range in response thereto. The recipient luminophoric medium 39 may be coated on the LED 34 using many different methods, with suitable methods being described above with reference to FIGS. 7A-7I, and/or in U.S. patent application Ser. Nos. 11/656,759 and 11/899,790. Alternatively, the recipient luminophoric medium 39 may be coated on the LED 34 using other methods such an electrophoretic deposition (EPD), with a suitable EPD method described in U.S. patent application Ser. No. 11/473,089. A silicate-based encapsulant (such as a potassium-silicate-based encapsulant) may be used to provide environmental and/or mechanical protection for the recipient luminophoric medium 39 in some embodiments.

An optical element or lens 70 (shown in FIGS. 8C-8D) is provided on the top surface 40 of the submount 32, over the LED 34, to provide environmental and/or mechanical protection. The lens 70 can be molded using different molding techniques such as those described in U.S. patent application Ser. No. 11/982,275. The lens 70 can be many different shapes such as, for example, hemispheric, and can be formed of various materials such as silicones, plastics, epoxies or glass. The lens 70 can be textured to improve light extraction. In some embodiments, the recipient luminophoric medium 39 may be incorporated into the lens 70.

The surface area of the LED chip 34 may cover more than 10% or even 15% of the surface area of the submount 32. In some embodiments, the ratio of the width W of the LED chip 34 to the diameter D of the lens 70 may be greater than 0.5. The top surface 40 of the submount 32 may include a die attach pad 42 with an integral first contact pad 44. A second contact pad 46 may also be included on the top surface 40 of the submount 32 with the LED 34 mounted approximately at the center of the die attach pad 42. The die attach pad 42 and first and second contact pads 44, 46 may comprise metals or other conductive materials such as, for example, copper. Seed layers and/or adhesion layers may be provided beneath the pads 42, 44, 46. The pads 42, 44, 46 may be patterned using standard lithographic processes. These pads 42, 44, 46 provide conductive paths for electrical connection to the LED 34 using known contacting methods. The pads 42, 44, 46 may also provide thermally conductive paths to conduct heat away from the LED 34.

A gap 48 (see FIG. 8A) is included between the second contact pad 46 and the die attach pad 42 down to the surface of the submount 32. An electrical signal is applied to the LED 34 through the first and second pads 44, 46, with the electrical signal on the first pad 44 passing directly to the LED 34 through the die attach pad 42 and the signal from the second pad 46 passing into the LED 34 through wire bonds. The gap 48 provides electrical isolation between the second pad 46 and the die attach pad 42 to prevent shorting of the signal applied to the LED 34.

Referring to FIGS. 8C and 8D, an electrical signal can be applied to the package 800 by providing external electrical contact to the first and second contact pads 44, 46 via first and second surface mount pads 50, 52 that are formed on the back surface 54 of the submount 32. Conductive vias 56 are formed through the submount 32 between the first mounting pad 50 and the first contact pad 44, and between the second mounting pad 52 and second contact pad 46 to provide electrical connections therebetween. In other embodiments, the pads 44, 46 may extend around the sides of the submount 32. The first and second mounting pads 50, 52 allow for surface mounting of the LED package 800, and the electrical signal may be applied to the LED 34 via the first and second mounting pads 50, 52.

A metalized area 66 is also provided on the back surface 54 of the submount 32, between the first and second mounting pads 50, 52. The metalized area 66 may be made of a heat conductive material and may be in at least partial vertical alignment with the LED 34. In some embodiments, the metalized area 66 is not in electrical contact with the elements on top surface of the submount 32 or the first and second mounting pads 50, 52 on the back surface of the submount 32. Heat passes into the submount 32 directly below and around the LED 34. This heat may spread into the metalized area 66, where it can dissipate more readily. The heat can also conduct from the top surface 40 of the submount 32, through the vias 56, where the heat can spread into the first and second mounting pads 50, 52 where it can also dissipate. The heat spreading from the LED 34 may be improved, which may improve the operating life of the device 800 and/or allow for higher operating power.

Figure 9A:
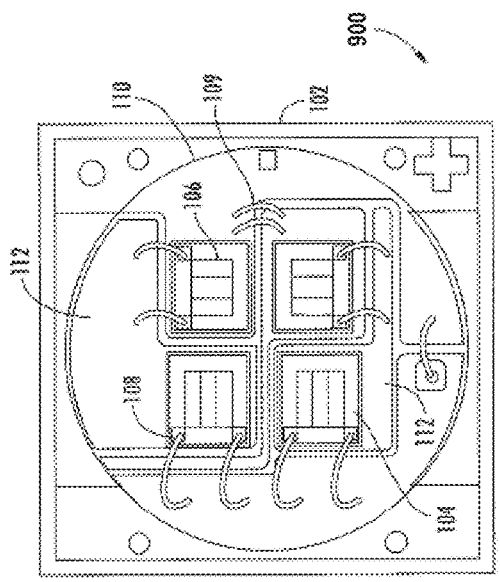
FIGS. 9A-9D are various views of a packaged light emitting device that includes multiple LED chips according to embodiments of the present disclosure.

FIGS. 9A-9D illustrate a packaged light emitting device 900 that includes multiple LEDs according to embodiments of the present disclosure. FIGS. 9A-9D illustrate a perspective view, a plan view, a side view and a bottom view of the device 900, respectively. As shown in FIG. 9A, the packaged light emitting device 900 includes four LED die 104, which are mounted on a common submount 102. The submount 102 and the LEDs 104 can be, for example, any of the submounts and LEDs that are discussed above with respect to FIGS. 8A-8D. In some embodiments, the LEDs 104 may, for example, each be an ultraviolet, violet or blue LED. In other embodiments, at least one the LEDs 104 may be an ultraviolet, violet or blue LED, while at least one other of the LEDs 104 may be an LED that emits radiation with a peak wavelength above 550 nm. For example, the LEDs 104 may include one or more LEDs that emit radiation with a peak wavelength in the blue color range and at least one or more LEDs 104 that emit radiation with a peak wavelength in the orange color range.

In some embodiments, one or more of the LEDs 104 (and the submount 102, if desired) may be coated with a recipient luminophoric medium (not shown), which includes at least one narrow-spectrum luminescent material but is free of broad-spectrum red-emitting luminescent materials according to any of the embodiments of the present disclosure. As discussed above, this recipient luminophoric medium may include one or more narrow-spectrum luminescent materials that absorb at least some of the light emitted by the LEDs 104 and emit light at different wavelengths. The recipient luminophoric medium may be applied to the LEDs 104 in any suitable manner, including techniques discussed in the present disclosure. The recipient luminophoric medium may alternatively be deposited onto and/or built into a lens 110 of the packaged light emitting device 900, or may be provided between the lens 110 and the LEDs 104.

Each LED 104 in the packaged light emitting device 900 may include a conductive current spreading structure 106 on its top surface such as the current spreading structures 36 discussed above with respect to light emitting device 800, as well as one or more contacts 108 that are accessible at its top surface for wire bonding. An optical element or lens 110 is formed on the top surface of the submount 102 over the LEDs 104 to provide environmental and/or mechanical protection. The lens 110 may be any of the lenses 70 discussed above with respect to the light emitting device 800.

Figure 9B:
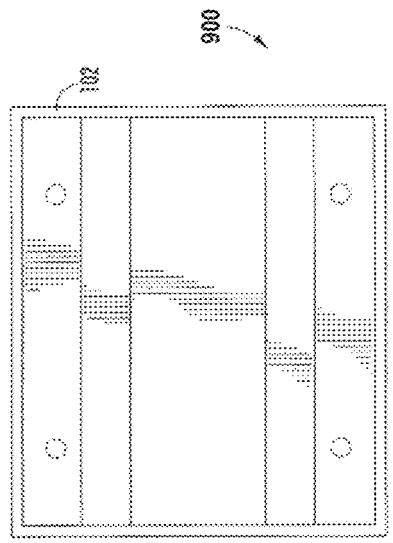
Figure 9C:
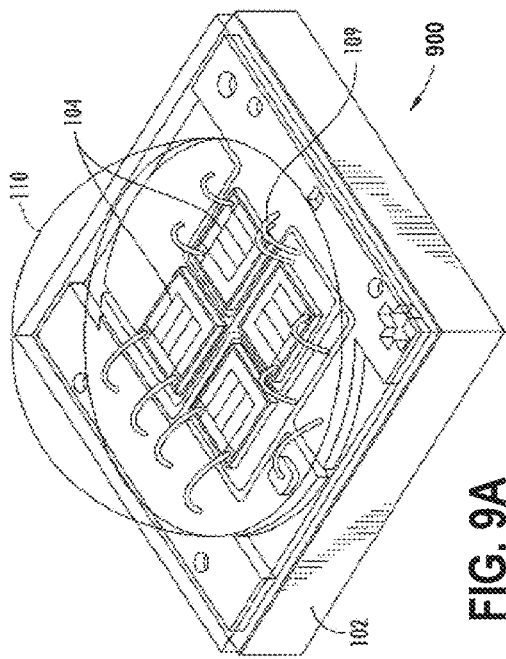

The top surface of the submount 102 may have patterned conductive features that can include die attach pads 112 which the LEDs 104 may be mounted on. Electrical contact may be made to each of the LEDs 104 using known wire bonding and contact methods such as, for example, those discussed above with respect to the light emitting device 800 of FIGS. 8A-8B and/or though electrical connections to the die attach pads 112. The die attach pads 112 may have reflective upper surfaces. The recipient luminophoric media according to embodiments of the present disclosure may be coated onto or otherwise deposited on these patterned conductive features in some embodiments, and may thereby act to further down-convert light emitted by the LEDs 104 that impinges on these reflective surfaces. While FIGS. 9A-9C illustrate two wire bonds being attached to contacts on the top side of each LED 104, it will be appreciated that fewer or more wire bonds and/or contacts may be used, on the top and/or bottom sides of each LED 104.

Figure 9D:
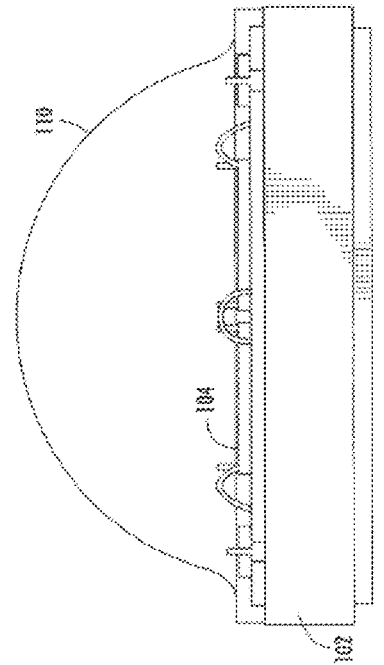
Figure 10A:
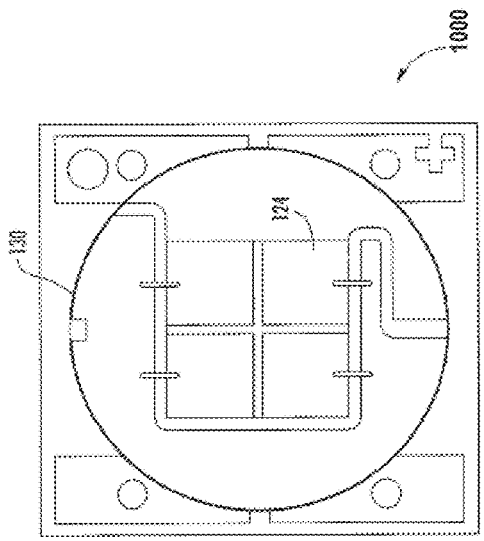
Figure 10D:
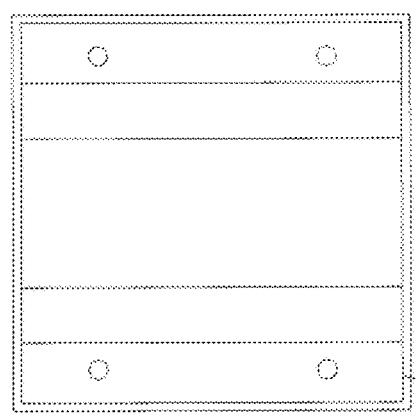
Figure 10A:
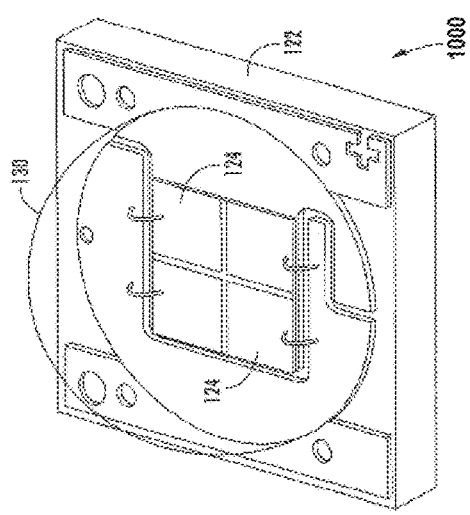
Figure 10C:
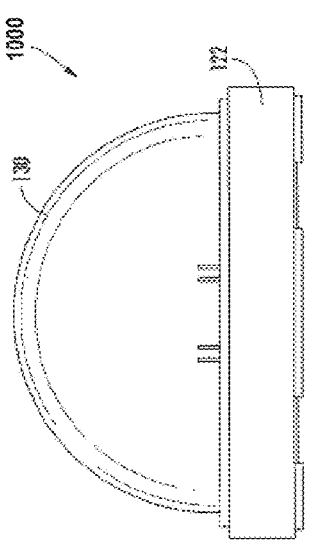

The bottom side of the packaged light emitting device 900 shown in FIG. 9D may be substantially identical to the bottom side of the packaged light emitting device 800 (albeit, likely larger). An electrical signal can be applied to the packaged light emitting device 900 by providing external electrical contact to first and second surface mount pads (not shown) that are formed on the back surface of the submount 102. This electrical signal may be applied to each of the LEDs 104 in the same manner, described above, that an electrical signal is provided to the LED 34 of FIGS. 8A-8D.

FIGS. 10A-10D illustrate another packaged light emitting device 1000 that includes multiple LEDs according to embodiments of the present disclosure. FIGS. 10A-10D illustrate a perspective view, a plan view, a side view and a bottom view of the device 1000, respectively. The packaged light emitting device 1000 is very similar to the packaged light emitting device 900 of FIGS. 9A-9D, with a primary difference being that the device 900 uses LEDs 104 that have two top-side contacts (and hence have two top-side wire bonds 109 between each LED chip 104 and the submount 102), while the device 1000 uses LEDs 124 that have a single top-side contact and hence have a single top-side wire bond between each LED chip 124 and the submount 122. Each of the LEDs 124 may operate in conjunction with a recipient luminophoric medium (not shown), which includes at least one narrow-spectrum luminescent material but is free of broad-spectrum red-emitting luminescent materials according to any of the embodiments of the present disclosure. The recipient luminophoric medium may be deposited, for example, on a top surface of the LEDs 124, deposited on and/or included within a lens 130 of the packaged light emitting device 1000, and/or provided between the lens 130 and the LEDs 124, using any suitable method of depositing a recipient luminophoric medium, including those discussed herein.

Figure 11A:
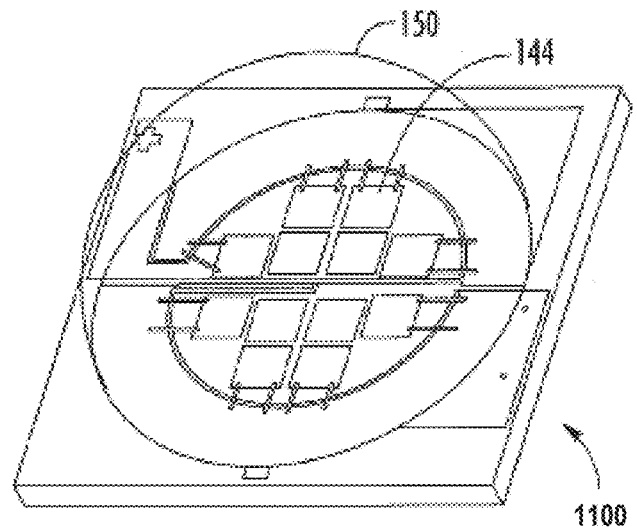
FIGS. 11A-11C are various views of yet another packaged light emitting device that includes multiple LED chips according to embodiments of the present disclosure.
Figure 11B:
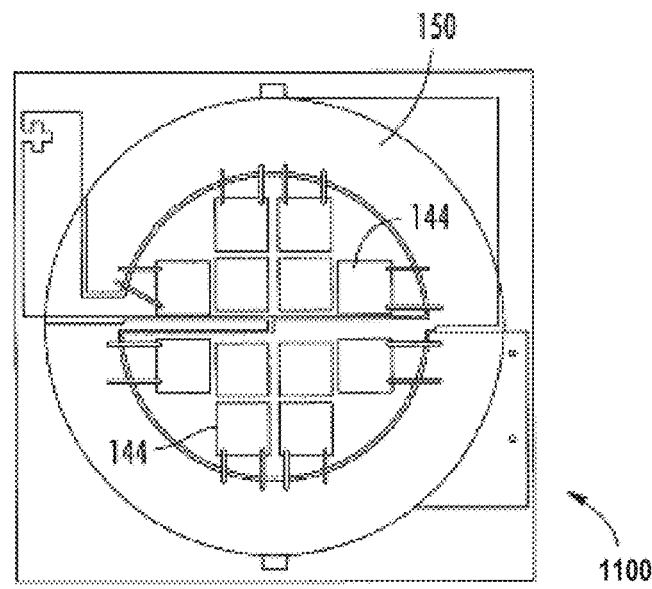
Figure 11C:
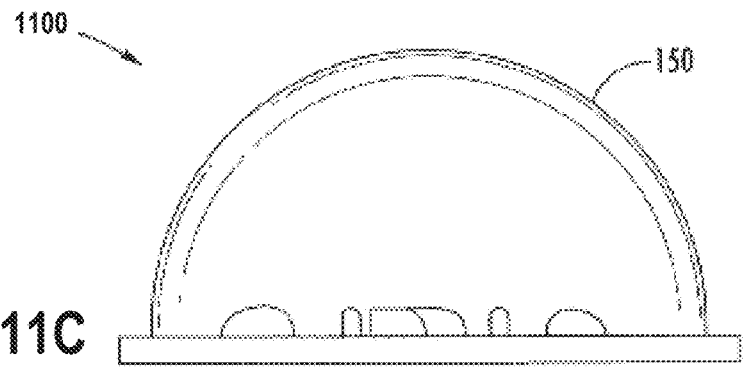

FIGS. 11A-11C illustrate another packaged light emitting device 1100 according to embodiments of the present disclosure that includes multiple LEDs. FIGS. 11A-11C illustrate a perspective view, a plan view and a side view of the device 1100, respectively. The device 1100 of FIGS. 11A-11C is similar to the device 900 of FIGS. 9A-9D, with the primary difference being that the packaged light emitting device 1100 includes a total of twelve LEDs 144 as opposed to four LEDs. The packaged light emitting device 1100 may include any of the recipient luminophoric media disclosed herein (not shown), which include at least one narrow-spectrum luminescent material but is free of broad-spectrum red-emitting luminescent materials. The recipient luminophoric medium may be deposited on a top surface of the LEDs 144, deposited on and/or included within a lens 150 of the packaged light emitting device 1100, and/or provided between the lens 150 and the LEDs 144 using any suitable method of depositing a recipient luminophoric medium, including those discussed herein.

While FIGS. 8A-11C illustrate several exemplary packaged light emitting devices that may include recipient luminophoric mediums according to embodiments of the present disclosure, these are provided by way of example and are not intended to be limiting. That is, the recipient luminophoric media including at least one narrow-spectrum luminescent material but without broad-spectrum red-emitting luminescent materials described herein may be included in other packaged light emitting devices.

Light emitting devices and including at least one at least one narrow-spectrum luminescent material for providing white light output described herein may have particular utility with respect to various form factor light fixtures, as shown by way of example with reference to FIGS. 12A-12E. For example, each of the embodiments disclosed herein may be implemented in various types of solid state light fixtures including, but not limited to, downlights, troffers, streetlights, canopy lights, parking garage lights, lights that use waveguide technology, and/or other lighting fixtures. As mentioned herein, many of such solid state light fixtures may be configured for outdoor lighting or other lighting applications that have different requirements than indoor lighting applications. For example, some outdoor lighting applications may have greater requirements with respect to output power, efficiency, and/or environmental protection, but lesser requirements with respect to the quality (as indicated by CRI) or correlated color temperature (CCT) of the light, which may be achieved by reduction and/or omission of broad-spectrum red-emitting luminescent materials.

Figure 12A:
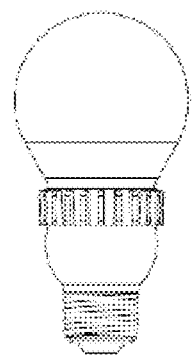
FIGS. 12A-12E are various views of example light fixtures that may utilize light emitting devices including at least one narrow-spectrum luminescent material for providing white light output according to some embodiments of the present disclosure.
Figure 12B:
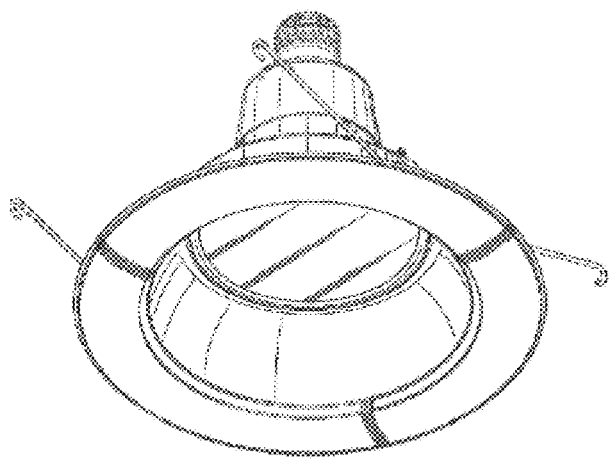
Figure 12C:
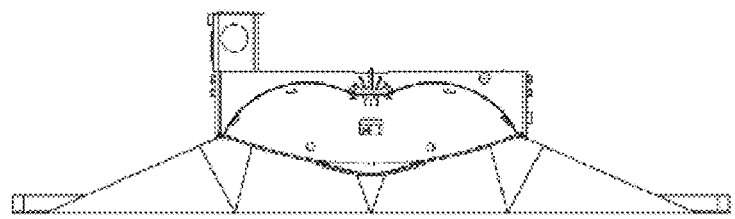
Figure 12D:
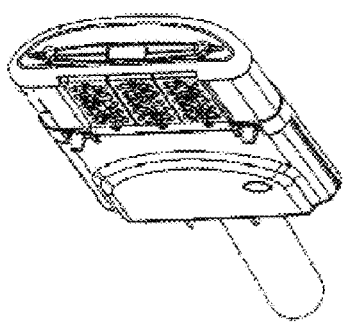
Figure 12E:
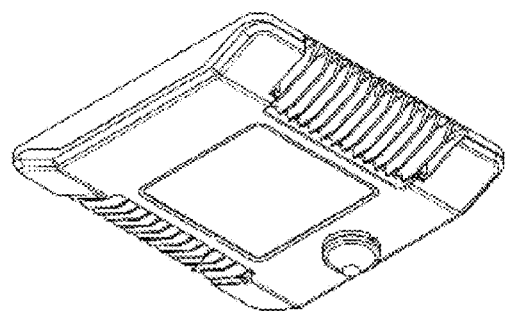

FIG. 12A illustrates an omnidirectional light bulb, such as an A19 bulb. Exemplary lights are described in U.S. Pat. Nos. 8,591,062 and 8,596,819 and U.S. Patent Publication No. 2015/0362168, each of which is hereby incorporated by reference. FIG. 12B shows another downlight that can incorporate light emitting devices described herein. An example of such a downlight is disclosed in U.S. Pat. No. 8,777,449, which is hereby incorporated by reference. FIG. 12C illustrates a troffer light fixture that can incorporate the light emitting devices described herein. An exemplary troffer light fixture is disclosed in U.S. Published Patent Publication No. US2012/0327650, which is hereby incorporated by reference. In another example, FIG. 12D illustrates a solid state streetlight that may include the light emitting devices described herein. Other streetlights and outdoor lighting fixtures that can be implemented using the light-emitting devices described herein include the lights disclosed in U.S. Pat. Nos. 8,622,584; 8,425,071; 9,028,087; and U.S. Patent Publication No. 2015/0253488, each of which is hereby incorporated by reference. FIG. 12E illustrates a canopy light which is described in U.S. Pat. No. 9,182,096, which is hereby incorporated by reference. Light emitting devices described herein may also be implemented in various other lighting fixtures, such as, for example, in the waveguide-based troffers disclosed in U.S. Patent Publication No. 2014/0347885, in the troffer style fixtures disclosed in U.S. Patent Publication No. 2012/0051041 and/or in the waveguide-based garage lights disclosed in U.S. Patent Publication No. 2014/0355302, each of which is hereby incorporated by reference. Semiconductor light emitting devices according to embodiments of the disclosure may include III-V nitride (e.g., gallium nitride) based LEDs fabricated on a silicon carbide, sapphire or gallium nitride substrates such as various devices manufactured and/or sold by Cree, Inc. of Durham, N.C. Such LEDs may (or may not) be configured to operate such that light emission occurs through the substrate in a so-called "flip chip" orientation. Semiconductor light emitting devices according to embodiments of the present disclosure include both vertical devices with a cathode contact on one side of the LED, and an anode contact on an opposite side of the LED and devices in which both contacts are on the same side of the device. Some embodiments of the present disclosure may use semiconductor light emitting devices, device packages, fixtures, luminescent materials, power supplies and/or control elements such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272. The design and fabrication of semiconductor light emitting devices are well known to those skilled in the art, and hence further description thereof will be omitted.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The present invention has been described above with reference to the accompanying drawings, in which certain embodiments are shown. However, this disclosure should not be construed as limited to the embodiments set forth herein. Rather, these embodiments are provided so that this disclosure will be thorough and complete, and will fully convey the scope of the disclosure to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

In the drawings and specification, there have been disclosed embodiments of the disclosure and, although specific terms are employed, they are used in a generic and descriptive sense only and not for purposes of limitation, the scope of the disclosure being set forth in the following claims.

That which is claimed:

1. A light emitting device, comprising:
   at least one light emitting diode ("LED");
   at least one first luminescent material that is configured to emit light having an emission peak in a wavelength range of 495 nanometers (nm) to 565 nm, responsive to light emitted by the at least one LED; and
   a second luminescent material that is configured to emit narrow-spectrum light having an emission peak in a wavelength range of 580 nm to 609 nm, responsive to light emitted by the at least one LED;
   wherein the light emitting device is configured to provide light output that includes a portion of the light emitted by the at least one LED, the light emitted by the first luminescent material, and the light emitted by the second luminescent material, and the light emitting device is free of broad-spectrum luminescent materials that are configured to emit light having an emission peak in a red wavelength range; and
   wherein the light output of the light emitting device has a color rendering index (CRI) of no greater than about 75.

2. The light emitting device of claim 1, wherein the emission peak in the wavelength range of 580 nm to 609 nm is between 590 nm and 609 nm, and wherein the narrow-spectrum light emitted by the second luminescent material having the emission peak in the wavelength range of 580 nm to 609 nm has a full width at half maximum (FWHM) of less than 40 nm.

3. The light emitting device of claim 1, wherein the light output of the light emitting device has a correlated color temperature (CCT) of about 2200 Kelvin (K) to about 4000 K or more, with a luminous efficacy of radiation of about 360 lumens per watt-optical (lm/W-optical) to about 450 lm/W-optical-and a luminous efficacy of about 275 lumens per blue optical watt (lm/blue-optW) to about 350 lm/blue-optW.

4. The light emitting device of claim 1, wherein the first luminescent material comprises at least one broad-spectrum luminescent material, and wherein the emission peak in the wavelength range of 580 nm to 609 nm is within about 50 nanometers (nm) or less of the emission peak in the wavelength range of 495 nm to 565 nm.

5. The light emitting device of claim 1, wherein the first luminescent material comprises a narrow-spectrum luminescent material, wherein the full width at half maximum emission bandwidths of the light emitted by the first and second luminescent materials are within respective non-overlapping wavelength ranges.

6. The light emitting device of claim 5, wherein the light output of the light emitting device is free of emission peaks between the emission peak in the wavelength range of 495 nm to 565 nm and the emission peak in the wavelength range of 580 nm to 609 nm.

7. The light emitting device of claim 1, wherein the narrow-spectrum light having the emission peak in the wavelength range of 580 nm to 609 nm is free of greater than 2% of integrated optical power intensity beyond 660 nanometers (nm).

8. The light emitting device of claim 1, further comprising:
   a third luminescent material that is configured to emit narrow-spectrum light having an emission peak in a wavelength range of 435 nm to 494 nm, responsive to light emitted by the at least one LED,
   wherein the light emitted by the LED comprises light in a wavelength range of 380 nm to 434 nm.

9. The light emitting device of claim 1, wherein the light emitting device is free of broad-spectrum luminescent materials that are configured to emit light having an emission peak in a wavelength range of 610 nm to 750 nm.

10. The light emitting device of claim 1, further comprising at least one broad-spectrum luminescent material having a peak wavelength outside of a red wavelength range.

11. The light emitting device of claim 1, further wherein the light output of the light emitting device has a CRI of at least about 50.

12. A light emitting device, comprising:
    a light emitting diode ("LED");
    at least one broad-spectrum luminescent material; and
    at least one narrow-spectrum luminescent material that is configured to absorb a portion of light generated by the LED and responsively emit light having an emission peak in an orange wavelength range,
    wherein the light emitting device is free of broad-spectrum luminescent materials that are configured to emit light having an emission peak in a red wavelength range;
    wherein the light emitting device is configured to provide light output that includes a portion of the light emitted by the LED, light emitted by the at least one broad-spectrum luminescent material, and the light emitted by the at least one narrow-spectrum luminescent material, and has a color rendering index (CRI) in a range of from about 50 to about 75; and
    wherein the at least one narrow-spectrum luminescent material comprises first and second narrow-spectrum luminescent materials that are configured to absorb first and second portions of the light emitted by the LED and emit light having emission peaks in orange and green wavelength ranges, respectively.

13. The light emitting device of claim 12, wherein the light output of the light emitting device has a correlated color temperature (CCT) of about 2200 Kelvin (K) to about 4000 K or more, and a luminous efficacy of about 275 lumens per blue optical watt (lm/blue-optW) to about 350 lm/blue-optW.

14. The light emitting device of claim 13, wherein the at least one broad-spectrum luminescent material is configured to absorb a portion of incident light and responsively emit light having an emission peak in a green or green/yellow wavelength range.

15. The light emitting device of claim 14, wherein the emission peak in the orange wavelength range is within about 50 nanometers (nm) or less of the emission peak in the green or green/yellow wavelength range.

16. The light emitting device of claim 12, wherein full width at half maximum emission bandwidths of the light emitted by the first and second narrow-spectrum luminescent materials are within respective non-overlapping wavelength ranges.

17. The light emitting device of claim 12, wherein the LED is configured to emit light in a violet wavelength range, and wherein the at least one narrow-spectrum luminescent material further comprises a third narrow-spectrum luminescent material that is configured to absorb a third portion of the light emitted by the LED and emit light having an emission peak in a blue wavelength range.

18. The light emitting device of claim 12, wherein the light emitted by the at least one narrow-spectrum luminescent material has the emission peak between 590 nanometers (nm) and 609 nm and has a full width at half maximum (FWHM) of 40 nm or less.

* * * * *